(12) United States Patent
Dutta et al.

(10) Patent No.: US 12,144,263 B2
(45) Date of Patent: Nov. 12, 2024

(54) STEPPED CONTACT WITHIN MEMORY REGION

(71) Applicant: International Business Machines Corporation, Armonk, NY (US)

(72) Inventors: Ashim Dutta, Clifton Park, NY (US); Lili Cheng, Rexford, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 472 days.

(21) Appl. No.: 17/489,888

(22) Filed: Sep. 30, 2021

(65) Prior Publication Data
US 2023/0098122 A1    Mar. 30, 2023

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
CPC ................................ H10N 50/80; H10B 61/00
See application file for complete search history.

(56) References Cited

U.S. PATENT DOCUMENTS

| | | | |
|---|---|---|---|
| 5,245,205 A | 9/1993 | Higasitani | |
| 7,786,546 B2 | 8/2010 | Hsu | |
| 8,648,441 B2 | 2/2014 | Hijioka | |
| 9,343,659 B1 | 5/2016 | Lu | |
| 9,831,121 B2 | 11/2017 | Okawa | |
| 10,797,224 B2 | 10/2020 | Raghavan | |
| 10,833,257 B1 | 11/2020 | Dutta | |
| 2013/0119494 A1 | 5/2013 | Li | |
| 2016/0365505 A1 | 12/2016 | Lu | |
| 2021/0104660 A1 | 4/2021 | Dutta | |
| 2022/0376166 A1* | 11/2022 | Kuo | H10N 50/01 |

* cited by examiner

*Primary Examiner* — Shih Tsun A Chou
(74) *Attorney, Agent, or Firm* — Matthew Zehrer

(57) ABSTRACT

A semiconductor device, such as an MRAM device, includes a stepped contact within a memory region that has a greater number of different contact structures (i.e., contact structures formed in different fabrication stages) relative to a logic region contact. The stepped contact includes a lower stepped contact and an upper stepped contact. The inclusion of the lower stepped contact allows for a relatively shorter upper stepped contact compared to the logic region contact. The stepped contact may allow the use of a multi-layer encapsulation spacer upon the sidewalls of a memory cell that fill out tight spacing therebetween, which may decrease the propensity of void formation and resulting shorting between neighboring memory cell features.

12 Claims, 15 Drawing Sheets

STEPPED CONTACT WITHIN MEMORY REGION

BACKGROUND

Various embodiments of the present application generally relate to semiconductor device fabrication methods and resulting structures. More specifically the various embodiments may relate to a Magneto-Resistive Random Access Memory (MRAM) semiconductor structure that includes a stepped contact within the MRAM memory region between Mx and Mx+1 wiring levels and a single contact within the MRAM logic region between Mx and Mx+1 wiring levels.

SUMMARY

In an embodiment of the present invention, a semiconductor device is presented. The semiconductor device includes a Mx wiring level which includes a pair of lower conductive memory contacts within a memory region, a landing contact between the pair of lower conductive memory contacts, and a lower logic contact within a logic region. The semiconductor device includes a conductive memory pillar upon each of the lower conductive memory contacts. The semiconductor device includes a lower step contact upon the landing contact and a magnetic tunnel junction stack upon each of the conductive memory pillars. Each magnetic tunnel junction stack includes a bottom electrode, magnetic tunnel junction layers upon the bottom electrode, and a top electrode upon the magnetic tunnel junction layers. The semiconductor device further includes a Mx+1 wiring level comprising an upper conductive memory contact upon each magnetic tunnel junction stack, an upper step contact upon the lower step contact, and an upper logic contact upon the lower logic contact.

In an embodiment of the present invention, a semiconductor device fabrication method is presented. The method includes forming a pair of lower conductive memory contacts within a memory region, forming a landing contact between the pair of lower conductive memory contacts, and forming a lower logic contact within a logic region. The method includes simultaneously forming a conductive memory pillar upon each of the lower conductive memory contacts and a lower step contact upon the landing contact. The method includes forming a magnetic tunnel junction stack upon each of the conductive memory pillars. Each magnetic tunnel junction stack includes a bottom electrode, magnetic tunnel junction layers upon the bottom electrode, and a top electrode upon the magnetic tunnel junction layers. The method includes forming an upper conductive memory contact upon each magnetic tunnel junction stack, forming an upper step contact upon the lower step contact, and forming an upper logic contact upon the lower logic contact.

In an embodiment of the present invention, another semiconductor device is presented. The semiconductor device includes a Mx wiring level which includes a pair of lower conductive memory contacts within a memory region, a landing contact between the pair of lower conductive memory contacts, and a lower logic contact within a logic region. The semiconductor device includes a conductive memory pillar upon each of the lower conductive memory contacts, each conductive memory pillar comprising a lower pillar contact and an upper pillar contact. The semiconductor device includes a lower step contact upon the landing contact and a magnetic tunnel junction stack upon each of the conductive memory pillars. Each MTJ stack includes a bottom electrode, magnetic tunnel junction layers upon the bottom electrode, and a top electrode upon the magnetic tunnel junction layers. The semiconductor device includes a Mx+1 wiring level comprising an upper conductive memory contact upon each magnetic tunnel junction stack, an upper step contact upon the lower step contact, and an upper logic contact upon the lower logic contact.

In an embodiment of the present invention, another semiconductor device fabrication method is presented. The method includes forming a pair of lower conductive memory contacts within a memory region, forming a landing contact between the pair of lower conductive memory contacts, and forming a lower logic contact within a logic region. The method further includes simultaneously forming a lower conductive memory pillar upon each of the lower conductive memory contacts and a lower step contact upon the landing contact. The method further includes forming an upper conductive memory pillar upon each of the lower conductive memory pillars. The method further includes forming a magnetic tunnel junction stack upon each of the upper conductive memory pillar. Each stack includes a bottom electrode, magnetic tunnel junction layers upon the bottom electrode, and a top electrode upon the magnetic tunnel junction layers. The method further includes forming an upper conductive memory contact upon each magnetic tunnel junction stack, forming an upper step contact upon the lower step contact, and forming an upper logic contact upon the lower logic contact.

These and other embodiments, features, aspects, and advantages will become better understood with reference to the following description, appended claims, and accompanying drawings.

DETAILED DESCRIPTION

Figure 1:
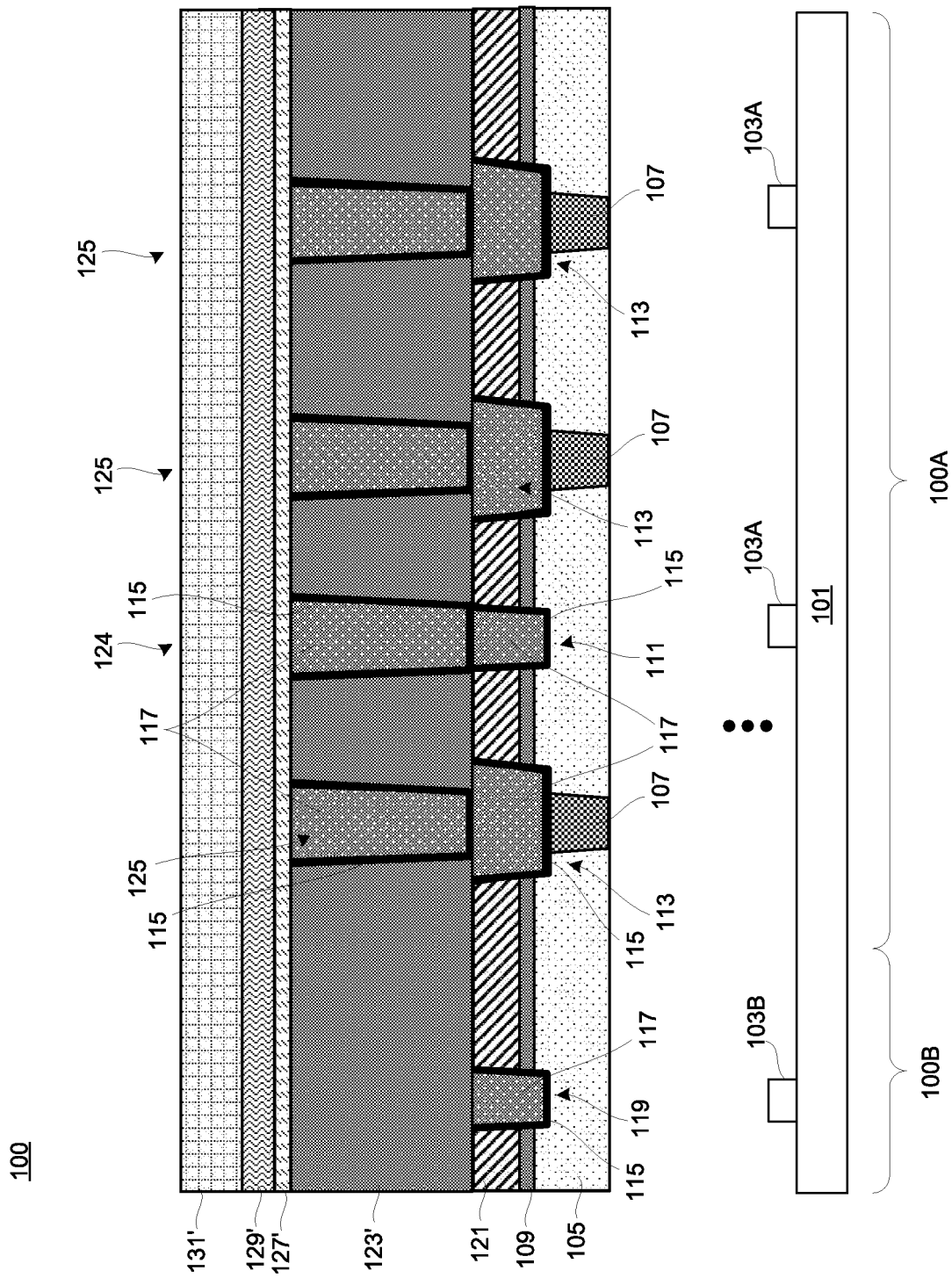
FIG. 1 through FIG. 13 depict cross-sectional views of a semiconductor device shown after respective fabrication operations, in accordance with one or more embodiments.

Semiconductor memories are used in integrated circuits for electronic applications, including radios, televisions, cell phones, and personal computing devices, as examples. One type of semiconductor memory device is MRAM, which involves spin electronics that combines semiconductor technology and magnetic materials and devices. The spins of electrons, through their magnetic moments, rather than the charge of the electrons, are used to indicate bit values.

A MRAM may include a logic region having logic circuit(s) and a memory region having embedded therein MRAM cell(s). A typical MRAM cell may include a MTJ stack over a bottom electrode and a top electrode over the MTJ stack.

In the various embodiments, a stepped, layered, or multipiece contact physically and electrically connects a Mx level conductive feature with a Mx+1 within the MRAM memory region while a single or one-piece contact physically and electrically connects a Mx level conductive feature with a Mx+1 within the MRAM logic region.

The stepped contact within the MRAM memory region may reduce the propensity of undesired void or opening formations that may occur when fabricating a single contact within the MRAM logic region. For example, voids may be common upon the formation of the single contact opening/ etch. Due to dense array of memory MTJ contacts or associated conductive features within the MRAM memory region, the voids could create a subway defect (i.e., when a void in the semiconductor device is undesirably filled with a conductive material which may cause electrical shorts, yield degradation, or the like). Similarly, due to the density of such conductive features in the MRAM memory region, it may be common for the single contact opening within the MRAM logic region to not land or expose the desired underlying conductive landing feature. As such, the current approach of forming a single or one-piece contact, intended to connect a Mx level conductive feature physically and electrically with a Mx+1 level conductive feature within the MRAM memory region, may result in subway defects and/or may lead to un-landing with the underlying Mx conductive feature.

The embodiments include the stepped contact used to connect an upper metal layer (Mx+1) conductive feature to a lower metal layer (Mx) conductive feature in the MRAM memory region, whereas in the MRAM logic region, the single contact connects an upper metal layer (Mx+1) conductive feature to a lower metal layer (Mx) conductive feature. The stepped contact may allow the use of relatively thicker multi-layer memory encapsulation spacers to fill out the tight spaces between memory pillars, thereby decreasing the propensity of void formation and associated subway defects. Formation of the stepped contact may further decrease the propensity of it being un-landing with the underlying Mx conductive feature. Such benefits may allow MRAM cell technology to fit within even further decreased density spacing requirements of advanced nodes.

It is understood in advance that although a detailed description is provided herein of an exemplary MRAM architecture that includes a stepped contact within the MRAM memory region, implementation of the teachings recited herein are not limited to the particular MRAM architecture described herein. Rather, embodiments of the present invention are capable of being implemented in conjunction with any other appropriate type of memory, semiconductor, or integrated circuit (IC) device now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, a MRAM generally includes two ferromagnetic plates, each of which can hold a magnetization, separated by a thin insulating layer. One of the two plates is generally a permanent magnet set to a particular polarity and the other plate's magnetization can be changed to match that of an external field to store memory. This configuration is known as a MTJ and is the simplest structure for an MRAM cell. A memory device may be built from a grid or array of such cells.

The MRAM may be read by measuring the electrical resistance of the cell. A particular cell is typically selected by powering an associated transistor that switches current from a supply line through the cell to ground. Because of tunnel magnetoresistance, the electrical resistance of the cell changes with the relative orientation of the magnetization in the two plates. By measuring the resulting current, the resistance inside any particular cell can be determined, and from this the magnetization polarity of the writable plate. Typically, if the two plates have the same magnetization alignment (low resistance state) this is considered to mean "1", while if the alignment is antiparallel the resistance will be higher (high resistance state) and this means "0".

FIGS. 1 through 13 are cross-sectional views of intermediate stages in the formation of a semiconductor device 100 and/or 200 in accordance with some embodiments. Referring to FIG. 1, the semiconductor device 100 includes a memory region 100A and a logic region 100B over a same substrate 101, where one or more memory devices (e.g., MRAM devices) are formed in the memory region 100A and one or more logic devices (e.g., logic circuits) are formed in the logic region 100B. In some embodiments, electrical components 103A and 103B are formed in or on the substrate 101, and an interconnect structure, which includes a plurality of dielectric layers and electrically conductive features (e.g., metal lines and vias) formed in the dielectric layers, are formed over the substrate 101 to connect to the electrical components 103A and 103B, respectively, to form functional circuits of the semiconductor device 100.

The substrate 101 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The electrical components 103A and 103B may be, e.g., transistors, diodes, capacitors, resistors, or the like, formed by any suitable formation method.

In some embodiments, the interconnect structure comprises a plurality of metallization layers that are formed over the substrate 101 and the electrical components 103A and 103B. The metallization layers may be denoted as Mx, where x=0, 1, 2, . . . , where M0 refers to the lowest (e.g., closest to the substrate 101) metallization layer, and the index x increases by 1 for each additional metallization layer. The metallization layer M0 comprises one or more Inter-Layer Dielectric (ILD) layers and electrically conductive features, such as contact plugs, within the ILD layer(s) to electrically connect to the electrical components 103A and 103B. The metallization layer Mx (with x greater or equal to 1) comprises an Inter-Metal Dielectric (IMD) layer and electrically conductive features (e.g., metal lines and/or vias) within the TMD layer. In some embodiments, electrically conductive features, such as conductive lines and vias, provide electrical connection to underlying conductive features, such as electrical components 103A and 103B, or the like.

The ILD layer(s) and the IMD layers may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), a low-k dielectric, or the like. The ILD layer(s) and the IMD layers may be formed by any acceptable deposition process, such as spin coating, physical vapor deposition (PVD), chemical vapor deposition (CVD), the like, or a combination thereof. The electrically conductive features in the ILD layer(s) and the IMD layers may be formed through any suitable process, such as deposition, damascene, dual damascene, the like, or combinations thereof.

FIG. 1 illustrates metallization layer Mx over the substrate 101. In some embodiments, the metallization layer Mx may be the metallization layer M0 and may contact the substrate 101. In other embodiments, other metallization layers may be interposed between the metallization layer Mx and the substrate 101. For simplicity, in subsequent figures, the substrate 101 and the electrical components 103A and 103B may not be illustrated.

In some embodiments, the metallization layer Mx comprises a dielectric layer(s) 121, 109, 105 and conductive features 111, 113, 119 within the dielectric layer(s) 121, 109, 105. In some embodiments, the dielectric layer 105 is a low-k dielectric layer having a k value lower than about 3.0, TEOS oxide (silicon oxide deposited using, e.g., a Chemical Vapor Deposition (CVD) method with Tetra Ethyl Ortho Silicate (TEOS) as a precursor), or the like, for example.

The dielectric layer 121 may also be formed of a low-k dielectric material with a k value lower than about 3.0, for example and may be formed using CVD, Physical Vapor Deposition (PVD), or the like.

In some embodiments, a dielectric layer 109, which may also be referred to as a cap layer, is formed between the dielectric layer 105 and the dielectric layer 121. In some embodiments, the dielectric layer 109 is formed of a dielectric layer that is different from the overlying dielectric layer 121. For example, the dielectric layer 109 may be formed of TEOS oxide, aluminum oxide, silicon oxide, silicon nitride, silicon oxynitride, silicon carbide, a combination thereof, or the like. The dielectric layer 109 may also be a composite layer formed of a plurality of dielectric layers. For example, the dielectric layer 109 may include a metal oxide layer, a metal nitride layer over the metal oxide layer, and may or may not include a metal oxynitride layer or a metal carbonitride layer over the metal nitride layer. The dielectric layer 109 may be formed using CVD, Physical Vapor Deposition (PVD), or the like.

The conductive features 111, 113, 119 may be formed of metals such as copper, aluminum, tungsten, cobalt, metal alloys thereof, or the like. In some embodiments where the metallization layer Mx is the metallization layer M0, the conductive features 111, 113, 119 may be contact plugs and conductive features 124, 125 there above, respectively, may be metal lines (such as word lines or bit lines), metal VIAs, doped semiconductor strips, or the like. In some embodiments, conductive features 125 may be referred to as memory pillars.

In the embodiment depicted, the metallization layer Mx includes the dielectric layer(s) 121, 109, 105 and conductive feature 125 is a lower contact that is or is later physically and electrically connected to a bottom electrode of the MTJ stack. Further, in the embodiment depicted, conductive feature 124 is a lower contact of a stepped contact 155, shown for example in FIG. 6. Conductive feature 124 may be formed simultaneously with conductive feature(s) 125.

In some embodiments, the conductive features 111, 113, 119, or the like, may be formed upon middle of line (MOL) interconnect(s) 107 that are located within or below dielectric layer 105 so as to provide electrical connection to underlying conductive features, such as electrical components 103A and 103B, or the like.

In other embodiments where the metallization layer Mx is a metallization layer with x greater than 0, the conductive features 111, 113, 119 may be metal lines, doped semiconductor strips, or the like, and the conductive feature(s) 125 may be VIAs, or the like. In such embodiment, conductive feature 125 may be the lower contact that is or is later physically and electrically connected to a bottom electrode of the MTJ stack. Further, in the embodiment depicted, conductive feature 124 is a lower contact of a stepped contact 155. Conductive feature 124 may have sidewalls that are coplanar, substantially coplanar, etc. with underlying sidewalls of conductive feature 111.

In some embodiments, conductive features 111, 113, 119 include conductive region(s) 117 and conductive barrier layer(s) 115 lining sidewalls and bottom surfaces of the conductive region(s) 117. The conductive barrier layer(s) 115 may be formed of titanium, titanium nitride, tantalum, tantalum nitride, cobalt, a combination thereof, or the like. The conductive region(s) 117 may be formed of metals such as copper, aluminum, tungsten, cobalt, alloys thereof, or the like. The formation of conductive features 111, 113, 119 may include etching the dielectric layer(s) to form openings, forming a blanket conductive barrier layer extending into the openings, depositing a metallic or conductive region(s) 117 over the blanket conductive barrier layer(s) 115, and performing a planarization process, such as a CMP process or a mechanical grinding process, to remove excess portions of the blanket conductive barrier layer(s) 115 and the conductive region(s) 117.

In some embodiments, dielectric layer 123' is formed over or upon Mx and conductive features 124, 125, such as conductive vias 125, and lower contact 124 of stepped contact 155, within the dielectric layer 123'. In some embodiments, the dielectric layer 123' may be formed of a TEOS oxide. In other embodiments, the dielectric layer 123' may be formed using PSG, BSG, BPSG, Undoped Silicate Glass (USG), Fluorosilicate Glass (FSG), SiOCH, flowable oxide, a porous oxide, or the like, or combinations thereof.

The conductive features 124, 125 may be formed within memory region 100A and may further be formed of metals such as copper, aluminum, tungsten, cobalt, metal alloys thereof, or the like. In some embodiments, as depicted, the conductive features 124, 125 are metal VIAs and the conductive features 111, 113 are word lines.

In some embodiments, conductive features 124, 125 include conductive region(s) 117 and conductive barrier layer(s) 115 lining sidewalls and bottom surfaces of the conductive region(s) 117. The conductive barrier layer(s) 115 may be formed of titanium, titanium nitride, tantalum, tantalum nitride, cobalt, a combination thereof, or the like.

The conductive region(s) 117 may be formed of metals such as copper, aluminum, tungsten, cobalt, alloys thereof, or the like. The formation of conductive features 124, 125 may include etching the dielectric layer(s) to form conductive features 124, 125 openings, forming a blanket conductive barrier layer extending into the conductive features 124, 125 openings, depositing a metallic or conductive region(s) 117 over the blanket conductive barrier layer(s) 115, and performing a planarization process, such as a CMP process or a mechanical grinding process, to remove excess portions of the blanket conductive barrier layer(s) 115 and the conductive region(s) 117. As depicted, conductive features 124, 125 may be formed in the same fabrication stage, may be formed simultaneously, or the like.

A bottom electrode (BE) layer 127' may be formed over the dielectric layer 123' and the conductive features 124, 125, MTJ layers 129' may be formed over the BE layer 127', and a top electrode (TE) layer 131' may be formed over the MTJ layers 129'. In some embodiments, the BE layer 127' is formed as a blanket layer, and may be formed using CVD, Physical Vapor Deposition (PVD), Electro-Chemical Plating (ECP), Electroless plating, or the like. The material of the BE layer 127' may include Cu, Al, Ti, Ta, W, Pt, Ni, Cr, Ru, TiN, TaN, combinations thereof, multi-layers thereof, or the like. In an embodiment where the BE layer 127' comprises a multilayer, the BE layer 127' may comprise a first layer and a second layer over the first layer, with the first layer being made of TaN and the second layer being made of TiN. In some embodiments, the first layer has a thickness between about 20 Å and about 150 Å. In some embodiments, the second layer has a thickness between about 30 Å and about 150 Å. In some embodiments, the BE layer 127' has a thickness between about 50 Å and about 300 Å.

In some embodiments, the MTJ layers 129' include a bottom magnetic electrode layer, a tunnel barrier layer over the bottom magnetic electrode layer, and a top magnetic electrode layer over the tunnel barrier layer. The bottom magnetic electrode layer may include a pinning layer and a pinned layer over and contacting the pinning layer. The top magnetic electrode layer may include a free layer. The bottom magnetic electrode layer, the tunnel barrier layer, and the top magnetic electrode layer may be deposited using one or more deposition methods such as, CVD, PVD, ALD, a combination thereof, or the like.

The pinning layer may be formed of a metal alloy including manganese (Mn) and another metal(s) such as platinum (Pt), iridium (Ir), rhodium (Rh), nickel (Ni), palladium (Pd), iron (Fe), osmium (Os), or the like. Accordingly, the pinning layer may be formed of PtMn, IrMn, RhMn, NiMn, PdPtMn, FeMn, Os, Mn, or the like. The pinning layer may have a thickness in the range between about 50 Å and about 200 Å.

The pinned layer may be formed of a ferromagnetic material with a greater coercivity field than top magnetic electrode layer and may be formed of materials 'such as cobalt iron (CoFe), cobalt iron boron (CoFeB), a combination thereof, or the like. The pinned layer may have a thickness in the range between about 50 Å and about 200 Å. In some embodiments, the pinned layer has a synthetic ferromagnetic (SFM) structure, in which the coupling between magnetic layers is ferromagnetic coupling. The bottom magnetic electrode layer may also adopt a synthetic antiferromagnetic (SAF) structure including a plurality of magnetic metal layers separated by a plurality of non-magnetic spacer layers. The magnetic metal layers may be formed of Co, Fe, Ni, or the like. The non-magnetic spacer layers may be formed of Cu, Ru, Ir, Pt, W, Ta, Mg, or the like. For example, the bottom magnetic electrode layer may have a Co layer and repeated (Pt/Co)x layers over the Co layer, with x representing repeating number and may be any integer equal to or greater than 1.

The tunnel barrier layer may be formed of a dielectric material, such as MgO, AlO, AlN, a combination thereof, or the like. The tunnel barrier layer may have a thickness in the range between about 1 nm and about 10 nm.

The top magnetic electrode layer may be formed of a ferromagnetic material such as CoFe, NiFe, CoFeB, CoFeBW, a combination thereof, or the like. The top magnetic electrode layer may also adopt a synthetic ferromagnetic structure, which is similar to the SAF structure, with the thickness of the spacer layer adjusted to achieve the ferromagnetic coupling between the separated magnetic metals, i.e., causing the magnetic moment to be coupled in the same direction. The magnetic moment of the top magnetic electrode layer is programmable, and the resistance of the resulting MTJ structure is accordingly changed between a high resistance and a low resistance. It is realized that the materials and the structure of the MTJ layers 129' may have many variations, which are also within the scope of the present disclosure. For example, the free layer may be the bottom layer of MTJ layers 129', while the pinning layer may be the top layer.

TE layer 131' may be formed over the MTJ layers 129'. In some embodiments, the TE layer 131' is formed as a blanket layer, and may be formed using CVD, PVD, ECP, electroless plating, or the like. The material of the TE layer 131' may include aluminum, titanium, tantalum, tungsten, alloys thereof, multi-layers thereof, or the like. In some embodiments, the TE layer 131' may be used as a hard mask in the subsequent patterning of the MTJ layers 129' and may include a conductive layer formed of TiN, Ta, TaN, Ti, Ru, W, Si, alloys thereof, multi-layers thereof, or the like.

In an embodiment where the TE layer 131' comprises a multilayer, the TE layer 131' may comprise a first layer, a second layer over the first layer, and a third layer over the second layer, with the first layer being made of Ta, the second layer being made of TaN, and the third layer being made of Ta. In some embodiments, the first layer has a thickness between about 50 Å and about 200 Å. In some embodiments, the second layer has a thickness between about 50 Å and about 200 Å. In some embodiments, the third layer has a thickness between about 50 Å and about 200 Å. In some embodiments, the TE layer 131' has a thickness between about 100 Å and about 600 Å. In some embodiments, the thickness of the TE layer 131' is greater than the thickness of the BE layer 127'.

After forming the TE layer 131', one or more masks (not shown) may be formed over the TE layer 131'. In some embodiments, the one or more masks may comprise one or more hard masks, a tri-layer mask, a combination thereof, or the like. In some embodiments, a hard mask layer is formed over the TE layer 131' and a tri-layer mask is formed over the hard mask layer. In some embodiments, the hard mask layer may comprise TiO, a TEOS oxide, a combination thereof, or the like. In some embodiments, the hard mask layer has a thickness between about 50 Å and about 300 Å.

Figure 2:
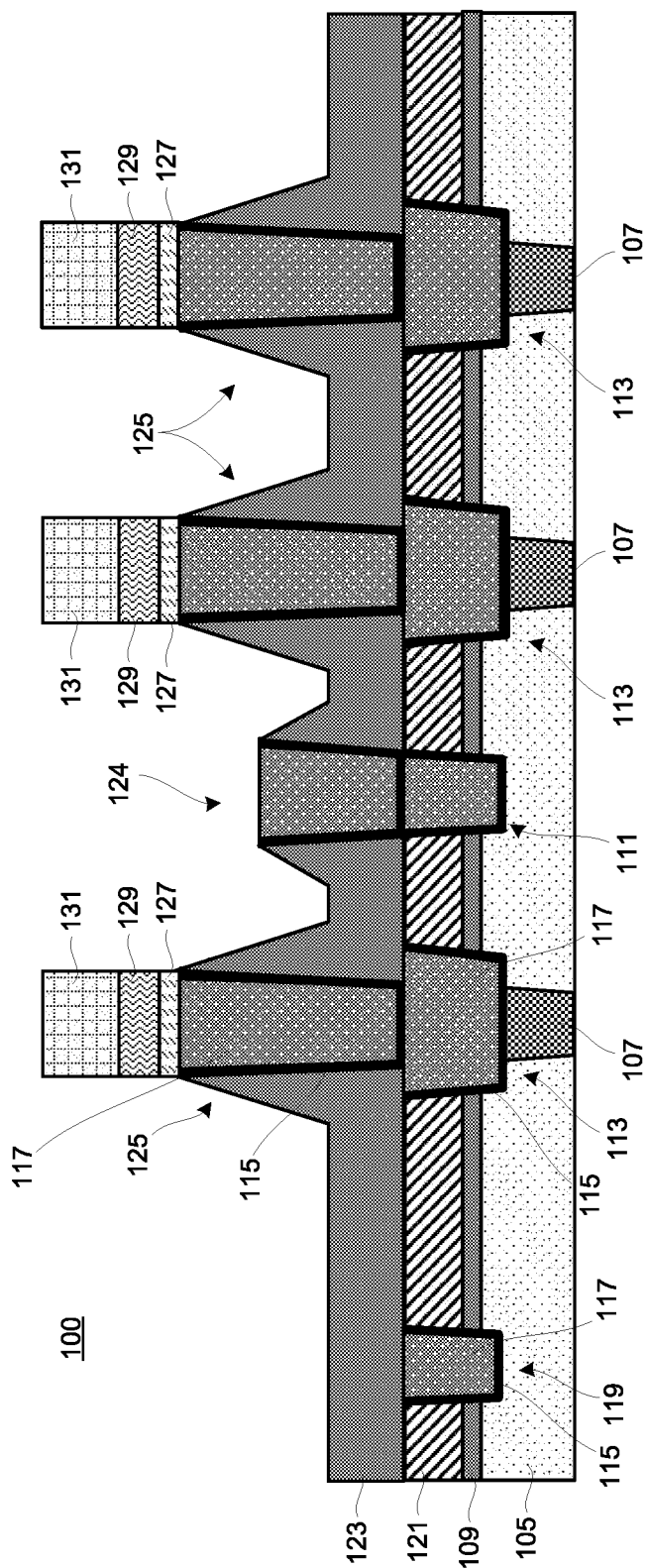

Referring to FIG. 2, MTJ stacks may be formed by patterning the BE layer 127', the MTJ layers 129', and the TE 131'. The patterning process forms a MTJ stack which may include a BE 127, formed from a retained portion of the BE layer 127', a MTJ 129, formed from a retained portion of the MTJ layers 129', and a TE 131, formed from a retained portion of the TE 131'. The layers of the MTJ stack may be generally vertically aligned with substantially coplanar sidewalls and may be located upon conductive features 125.

In some embodiments, the MTJ stack patterning process may partially etch the dielectric layer 123' and resulting form dielectric layer 123. In such embodiments, the dielectric layer 123 comprises a sloped portion (generally associated with the conductive features 124, 125) and flat portion(s). In some embodiments, top surfaces of the sloped portions are above a top surface of the flat portion. In some embodiments, the sloped portions have sloped sidewalls. In some embodiments, the sloped portions have trapezoidal shapes in the illustrated cross-section.

In some embodiments, the MTJ stack patterning process may partially recess conductive feature 124. More specifically, a MTJ stack does not protect the conductive feature 124 during the MTJ stack pattering process. As such, conductive feature 124 may be exposed to various subtractive removal techniques or materials (e.g., etchants, etc.) utilized in the patterning of the MTJ stacks that may partially recess the conductive feature 124 relative to conductive feature 125.

In some embodiments, the MTJ stack has sloped sidewalls. In some embodiments, a width of the TE 131 is less than a width of the BE 127. In some embodiments, the MTJ stack has substantially vertical sidewalls. In some embodiments, a width of the TE 131 is substantially the same width as BE 127.

In some embodiments, the one or more MTJ stack formation etching processes may include a plasma etching method, such as an IBE process. In some embodiments, the IBE process may be performed in conjunction with a magnetic treatment that allows for avoiding the electrical shorting caused by the re-sputtering of metal elements on sidewalls of the MTJ stack occurring during the IBE process. In some embodiments, the magnetic treatment removes metallic particles from the sidewalls of the MTJ stack.

Figure 3:
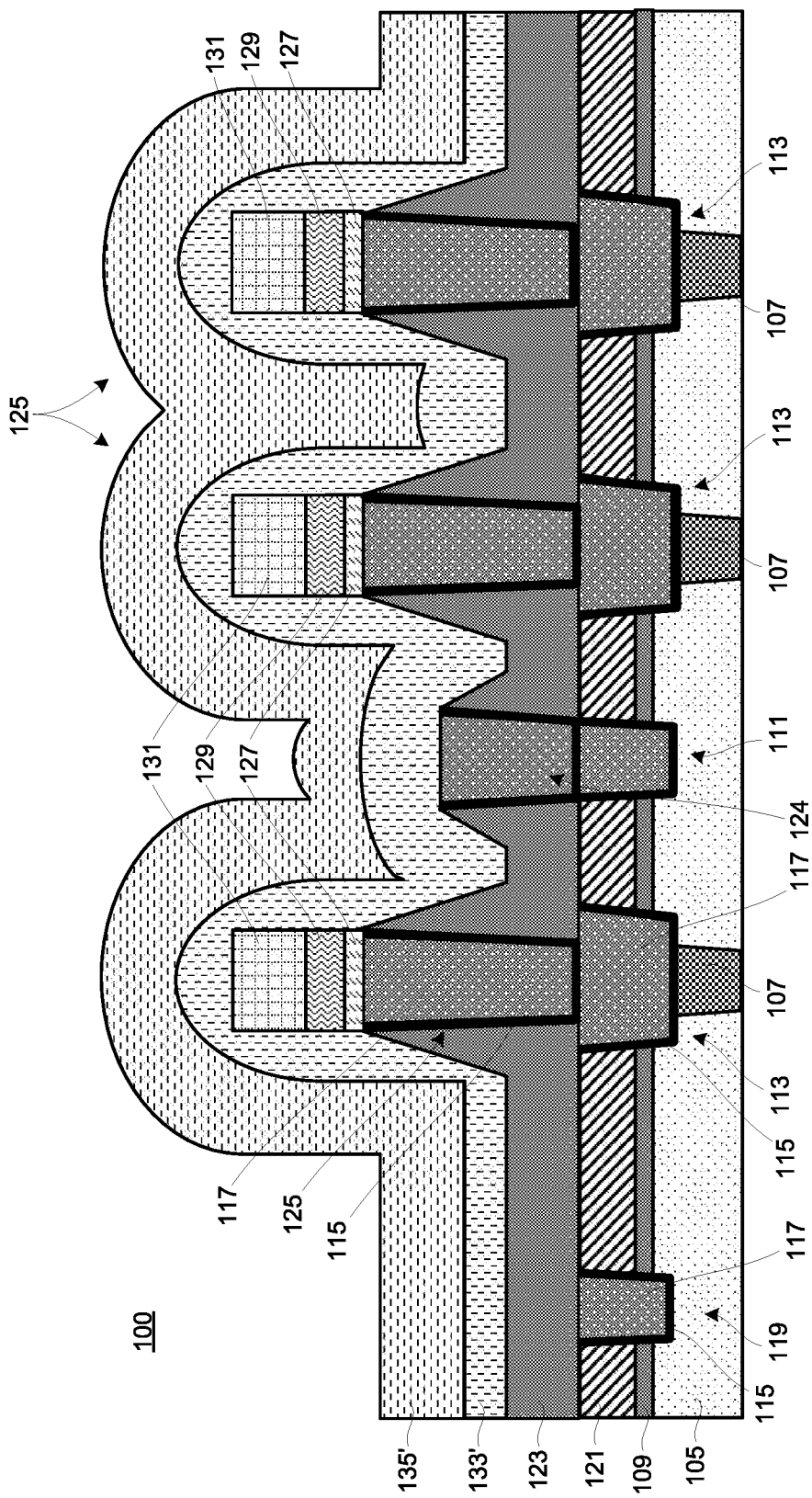

Referring to FIG. 3, after MTJ stack formation, various protective layers may be formed on sidewalls and top surfaces of the MTJ stack. In some embodiments, oxide layers may be formed on sidewalls of the MTJ stack. In some embodiments, the oxide layers comprise oxides of metal elements that form the MTJ stack and may be formed using an oxidation process. In some embodiments, the oxide layers prevent electron flow along the sidewalls of the MTJ stack that may adversely affect magnetic performance of the MTJ layers 129. In some embodiment, the oxide layers may have a thickness between about 5 Å and about 15 Å.

In some embodiments, a passivation layer 133' is blanket formed over the MTJ stack, upon dielectric layer 123, and upon the conductive feature(s) 124. In some embodiments, the passivation layer 133' may comprise silicon oxide, silicon nitride, silicon oxynitride, silicon carbide, silicon carbonitride, a combination thereof, or the like, and may be formed using CVD, PECVD, ALD, PELAD, PVD, a combination thereof, or the like. In some embodiments, the passivation layer 133' may reduce or prevent moisture ($H_2O$) diffusion into the MTJ stack. In some embodiments, the passivation layer 133' may have a thickness between about 100 Å and about 800 Å.

In some embodiments, a second passivation layer 135' may be formed over passivation layer 133'. Subsequently, an oxide layer (not shown) may be formed over the passivation layer 135'. In some embodiments, the second passivation layer 135' may be formed using similar materials and methods as the passivation layer 133' described above and the description is not repeated herein. In some embodiments, the oxide layer may comprise silicon oxide, or the like, and may be formed using CVD, PECVD, ALD, PELAD, a combination thereof, or the like.

Figure 4:
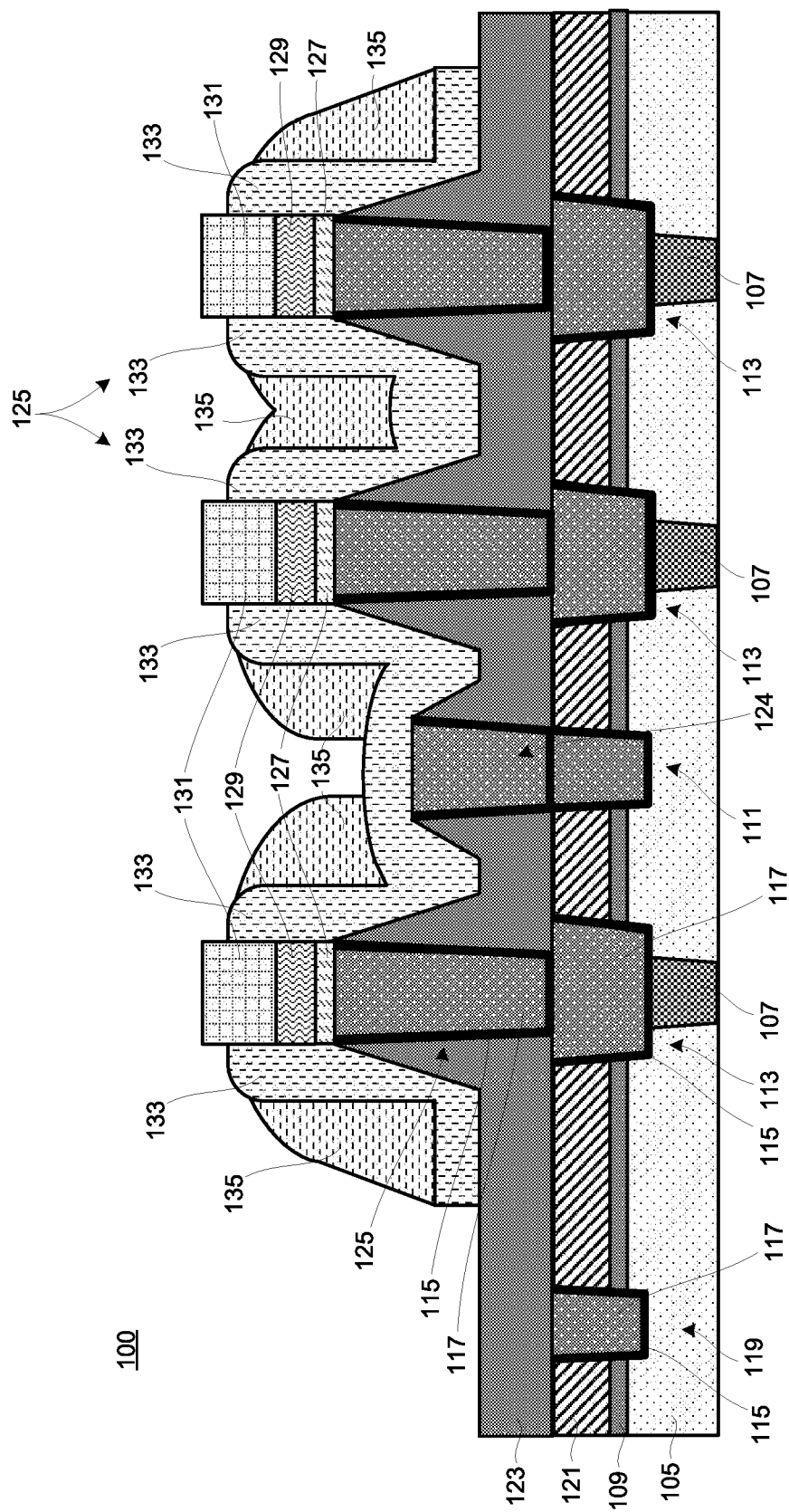

Referring to FIG. 4, an etching process, such as a dry etch, may be performed to etch the passivation layer(s) 133', 135' and to expose top portions of the MTJ stack (e.g., top surface and top sidewall portion(s) of the TE 131). Retained portion(s) of the passivation layer(s) 133', 135' form encapsulation spacers 133, 135, respectively. Encapsulation spacer 133 may be further located upon the sidewalls of the MTJ stack and may be further located upon the sloped portion of dielectric layer 123. Spacer 133 may further be formed upon the conductive feature(s) 124. In some embodiments, the etching process is an anisotropic etching process and removes horizontal portions of the passivation layer 133', 135'.

Figure 5:
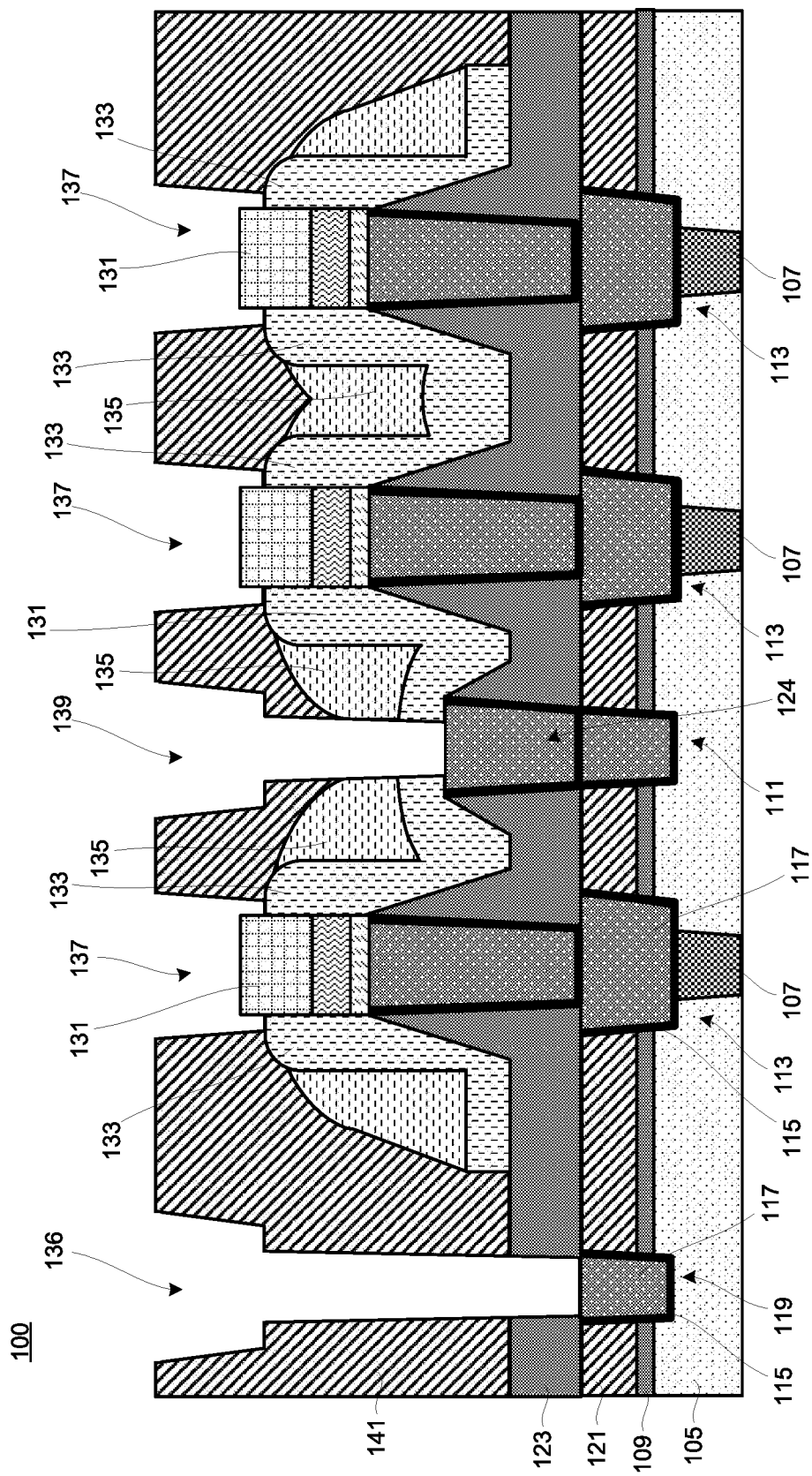

Referring to FIG. 5, one or more inter-layer dielectric 141 layer(s) may be formed upon the dielectric layer 123, upon encapsulation spacer(s) 133, 135, and upon the exposed portion of the MTJ stack. In some embodiments, the dielectric layer(s) 141 may be formed using similar materials and methods as the dielectric layer 121 or other inter-layer dielectrics described above, and the description is not repeated herein. Inter-layer dielectric 141 may be formed to an adequate thickness so that there is a distance between 50 nm and 300 nm between the top surface of the MTJ stack (e.g., top surface of the TE 131) and the top surface of the inter-layer dielectric 141.

Figure 6:
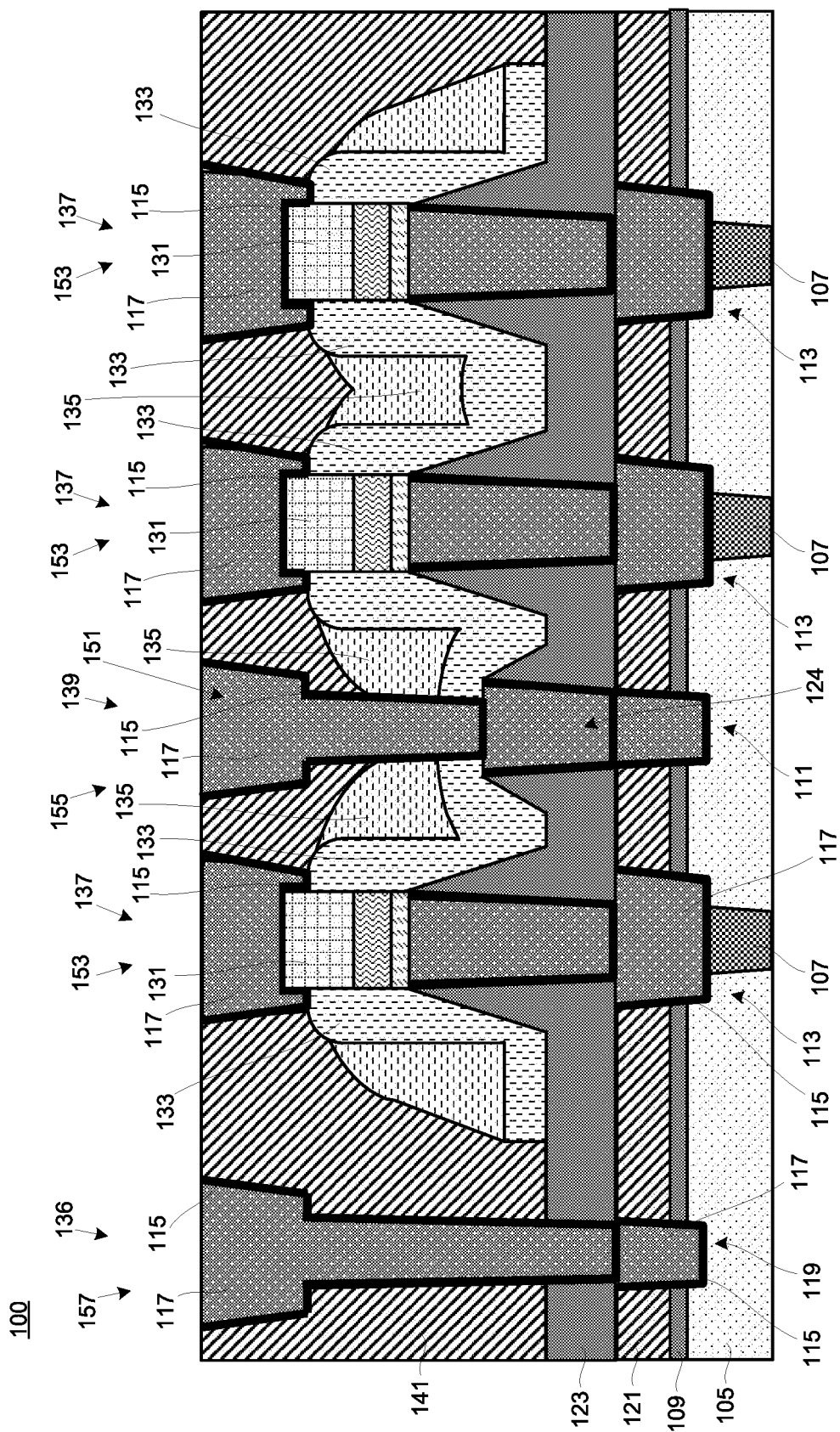

Referring to FIG. 5, upper contact opening 139 of the stepped contact 155, shown for example in FIG. 6, may be formed in the dielectric layer 141 and may generally exposes at least a portion (e.g., top surface, etc.) of the conductive feature 124. Upper contact opening 139 may be formed using suitable fabrication methods such as damascene, dual-damascene, or similar processes. Upper contact opening 139 may expose sidewall portion(s) of encapsulation spacer(s) 133, 135 associated with a first MTJ stack and may expose sidewall portion(s) of encapsulation spacer(s) 133, 135 associated with a second MTJ stack that neighbors the first MTJ stack. As depicted, upper contact opening 139 may have a VIA portion that exposes the portion the conductive feature 124 and have a wiring line (e.g., word line) portion over the VIA portion.

Referring to FIG. 5, MTJ contact opening 137 may be formed in the dielectric layer 141 and may generally exposes at least a portion (e.g., top surface of TE 131, top sidewall portions of TE 131, etc.) of the MTJ stack. MTJ contact opening 137 may further expose a portion of encapsulation spacer 133, 135. Upper contact opening 137 may be formed using suitable fabrication methods such as damascene, dual-damascene, or similar processes.

Referring to FIG. 5, logic contact opening 136 may be formed in the dielectric layer 141 and the dielectric layer 123 and may generally expose at least a portion (e.g., top surface, etc.) of the conductive feature 119. Logic contact opening 136 may be formed using suitable fabrication methods such as damascene, dual-damascene, or similar processes. As depicted, logic contact opening 136 may have a VIA portion that exposes the portion the conductive feature 119 and have a wiring line portion (e.g., word line) over the VIA portion.

In some embodiments, upper contact opening 139, MTJ contact opening 137, and/or logic contact opening 136 may be formed in the same fabrication stage, may be formed simultaneously, or the like.

In some embodiments, one or more mask layers (not shown) upon inter-layer dielectric 141 may aid in formation of upper contact opening 139, MTJ contact opening 137, and/or logic contact opening 136. In some embodiments, logic contact opening 136 and/or upper contact opening 139 are formed by a via-first process. In other embodiments, logic contact opening 136 and/or upper contact opening 139 are formed by a trench-first process.

Referring to FIG. 6, upper contact 151 of the stepped contact 155 is formed in the dielectric layer(s) 141 upon and physically connected to the conductive feature 124 within upper contact opening 139. The upper contact 151 may be a conductive line, VIA, or other conductive wiring feature, and may be formed using suitable formation methods such as damascene, dual-damascene, deposition, plating, combinations thereof, or the like. The upper contact 151 may include a VIA portion that physically and electrically connects to the portion the conductive feature 124 exposed by upper contact opening 139. The upper contact 151 may further include a wiring line (e.g., word line) portion over or upon the VIA portion.

As depicted, the wiring line portion of the upper contact 151 may be located within the Mx+1 wiring level. As such, stepped contact 155 may be formed and may include multiple conductive features (i.e., conductive feature 124 and VIA portion of upper contact 151) that physically and electrically connects the Mx+1 wiring level (i.e., wiring line portion of upper contact 151) with the Mx wiring level (i.e., conductive feature 111).

Referring to FIG. 6, upper MTJ contact 153 is formed in the dielectric layer(s) 141 upon and physically connected to the MTJ stack (e.g. TE 131) exposed within MTJ contact opening 137. The upper MTJ contact 153 may be a conductive line, VIA, or other conductive wiring feature, and may be formed using suitable formation methods such as damascene, dual-damascene, deposition, plating, combinations thereof, or the like. As depicted, upper MTJ contact 153 may be located within the Mx+1 wiring level.

Referring to FIG. 6, logic region contact 157 may be formed in the dielectric layer(s) 141 and in dielectric layer 123 upon and physically connected to conductive feature 119. Logic region contact 157 may be formed within logic region 100B and may be a conductive line, VIA, or other conductive wiring feature. The logic region contact 157 may be formed using suitable formation methods such as damascene, dual-damascene, deposition, plating, combinations thereof, or the like. The logic region contact 157 may include a VIA portion that physically and electrically connects to the portion of the conductive feature 119 exposed by logic contact opening 136. The logic region contact 157 may further include a wiring line (e.g., word line) portion over or upon the VIA portion.

As depicted, the wiring line portion of logic region contact 157 may be located within the Mx+1 wiring level. As such, logic region contact 157 may include a single conductive feature (i.e., VIA portion of logic region contact 157) that physically and electrically connects the Mx+1 wiring level (i.e., wiring line portion of logic region contact 157) with the Mx wiring level (i.e., conductive feature 119).

As depicted, upper contact 151, upper MTJ contact 153, and logic region contact 157 may be formed in the same fabrication stage, may be formed simultaneously, or the like.

In some embodiments, upper contact 151, upper MTJ contact 153, and/or logic region contact 157 includes conductive region(s) 117 and conductive barrier layer(s) 115 lining sidewalls and bottom surfaces of the conductive region(s) 117. A planarization process, such as CMP process or a mechanical grinding process, may remove excess upper contact 151 material(s), upper MTJ contact 153 material(s), and logic region contact 157 material(s) and may planarize the top surface of dielectric layer 141, the top surface of upper contact 151, upper MTJ contact 153, and logic region contact 157.

For clarity, semiconductor device 100 may include stepped contact 155, which includes a greater number of different contact structures (i.e., contact structures formed in different fabrication stages) relative to logic region contact 157. In other words, stepped contact 155 includes a greater number of different contact structures that physically connect the Mx wiring level to the Mx+1 wiring level relative to the logic region contact 157.

For clarity, semiconductor device 100 may include conductive feature 124 and conductive feature 125, which may be simultaneously formed, and in which the top surface of conductive feature 124 is below the top surface of conductive feature 125. The lower top surface of conductive feature may be caused, at least in part, by partial erosion of conductive feature 124 during MTJ stack formation and the absence of an MTJ stack there above. Conductive feature 124 and conductive feature 125 are formed above the Mx wiring level and formed within the memory region 100A of semiconductor device 100.

For clarity, the lower or bottom surface of upper contact 151 of the stepped contact 155 is above the lower or bottom surface of logic region contact 157. In other words, the length of upper contact 151 is shorter than the length of logic region contact(s) 157.

The inclusion of stepped contact 155 may allow the use of a multi-layer encapsulation spacers 133, 135 that fill out tight spacing between memory pillars (i.e., conductive features 125) and associated MTJ stacks, and which may decrease the propensity of void formation and resulting shorting between neighboring memory pillars and/or between neighboring MTJ stacks. As the spacing pitches continue to decrease in advanced nodes, the inclusion of stepped contact(s) 155, where needed, may allow for continued inclusion of MRAM technology therein.

Figure 7:
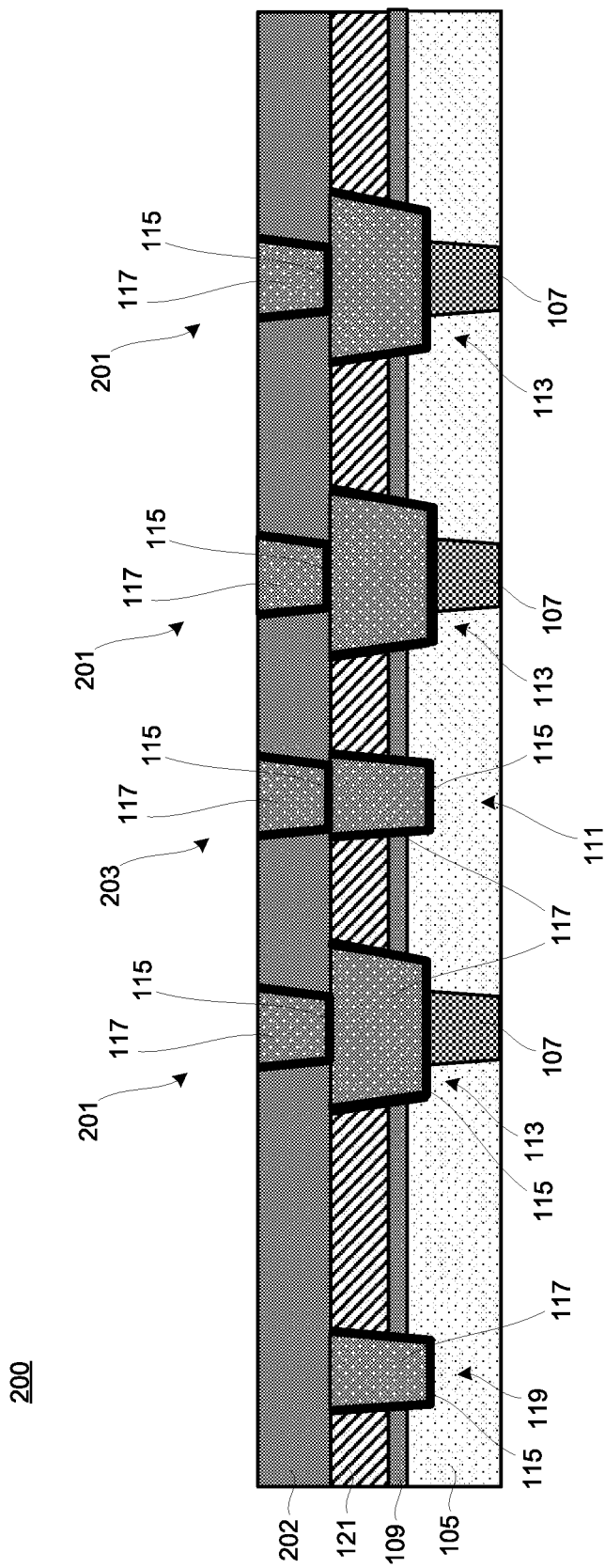

Referring to FIG. 7, the alternative semiconductor device 200 is depicted. Semiconductor device 200 may be formed using similar methods relative to semiconductor device 100 and such similar methods are not repeated. As depicted, dielectric layer(s) 202 is formed over or upon the Mx wiring level and conductive features 201, 203 are formed within the dielectric layer 202 in memory region 100A. In some embodiments, the dielectric layer 202 or layers may be formed of the same material(s) and same techniques as dielectric layer 123'. Dielectric layer(s) 202 may be formed to a thickness between 300 Å and 1000 Å.

The conductive features 201, 203 may be formed of metals such as copper, aluminum, tungsten, cobalt, metal alloys thereof, or the like. In some embodiments, as depicted, the conductive features 201, 203 are metal VIAs, metal pillars, metal plugs, or the like. Conductive features 201 are generally associated with a lower contact to a MTJ stack and conductive feature 203 is a lower contact of stepped contact 155, as is exemplary depicted in FIG. 13.

In some embodiments, conductive features 201, 203 include conductive region(s) 117 and conductive barrier layer(s) 115 lining sidewalls and bottom surfaces of the conductive region(s) 117. The formation of conductive features 201, 203 may include etching the dielectric layer(s) 202 to form conductive feature 201, 203 openings, forming a blanket conductive barrier layer extending into the conductive feature 201, 203 openings, depositing a metallic or conductive region(s) 117 over the blanket conductive barrier layer(s) 115, and performing a planarization process, such as a CMP process or a mechanical grinding process, to remove excess portions of the blanket conductive barrier layer(s) 115 and the conductive region(s) 117. As depicted, conductive features 201, 203 may be formed in the same fabrication stage, may be formed simultaneously, or the like. Conductive features 201, 203 are generally formed over, such as directly upon, the Mx wiring level. Conductive feature 201 are generally formed over, such as directly upon, and may be physically and electrically connected to a respective conductive feature 113. Conductive feature 203 are generally formed over, such as directly upon, and may be physically and electrically connected to a respective conductive feature 111.

Figure 8:
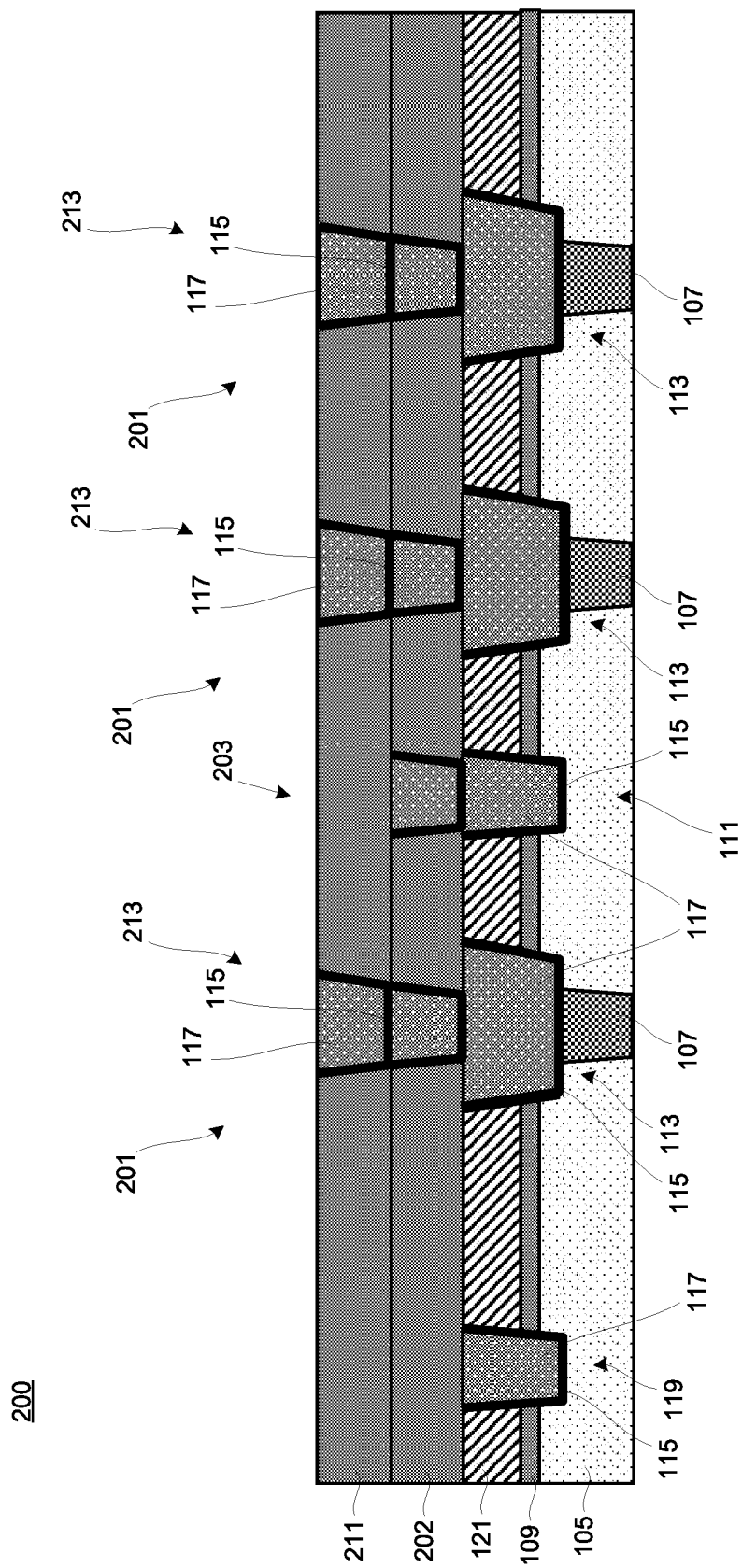

Referring to FIG. 8, dielectric layer(s) 211 is formed over or upon the Mx wiring level and conductive features 213 are formed within the dielectric layer 211 within memory region 100A. In some embodiments, the dielectric layer 211 or layers may be formed of the same material(s) and same techniques as dielectric layer 123' and/or dielectric layer 202. Dielectric layer(s) 211 may be formed to a thickness between 300 Å and 1000 Å.

The conductive features 213 may be formed of metals such as copper, aluminum, tungsten, cobalt, metal alloys thereof, or the like. In some embodiments, as depicted, the conductive features 213 are metal VIAs, metal pillars, metal plugs, or the like. Conductive feature 213 is generally associated with a lower contact to a MTJ stack and are formed upon a conductive feature 201.

In some embodiments, conductive features 213 include conductive region(s) 117 and conductive barrier layer(s) 115 lining sidewalls and bottom surfaces of the conductive region(s) 117. The formation of conductive features 213 may include etching the dielectric layer(s) 211 to form conductive feature 213 openings, forming a blanket conductive barrier layer extending into the conductive feature 213 openings, depositing a metallic or conductive region(s) 117 over the blanket conductive barrier layer(s) 115, and performing a planarization process, such as a CMP process or a mechanical grinding process, to remove excess portions of the blanket conductive barrier layer(s) 115 and the conductive region(s) 117. As depicted, conductive features 213 may be formed in the same fabrication stage, may be formed simultaneously, or the like. Conductive features 213 are generally formed over the Mx wiring level. In embodiments, sidewall(s) of conductive feature 213 may be substantially coplanar with sidewalls of an associated conductive feature 201 there below. Such sidewalls may be substantially vertical or sloped, as depicted.

As depicted, dielectric layer(s) 211 may be formed over, such as directly upon, conductive feature 203. Similarly, dielectric layer(s) 202 and dielectric layer(s) 211 may be formed over, such as directly upon, conductive feature 119 within the Mx wiring level.

Figure 9:
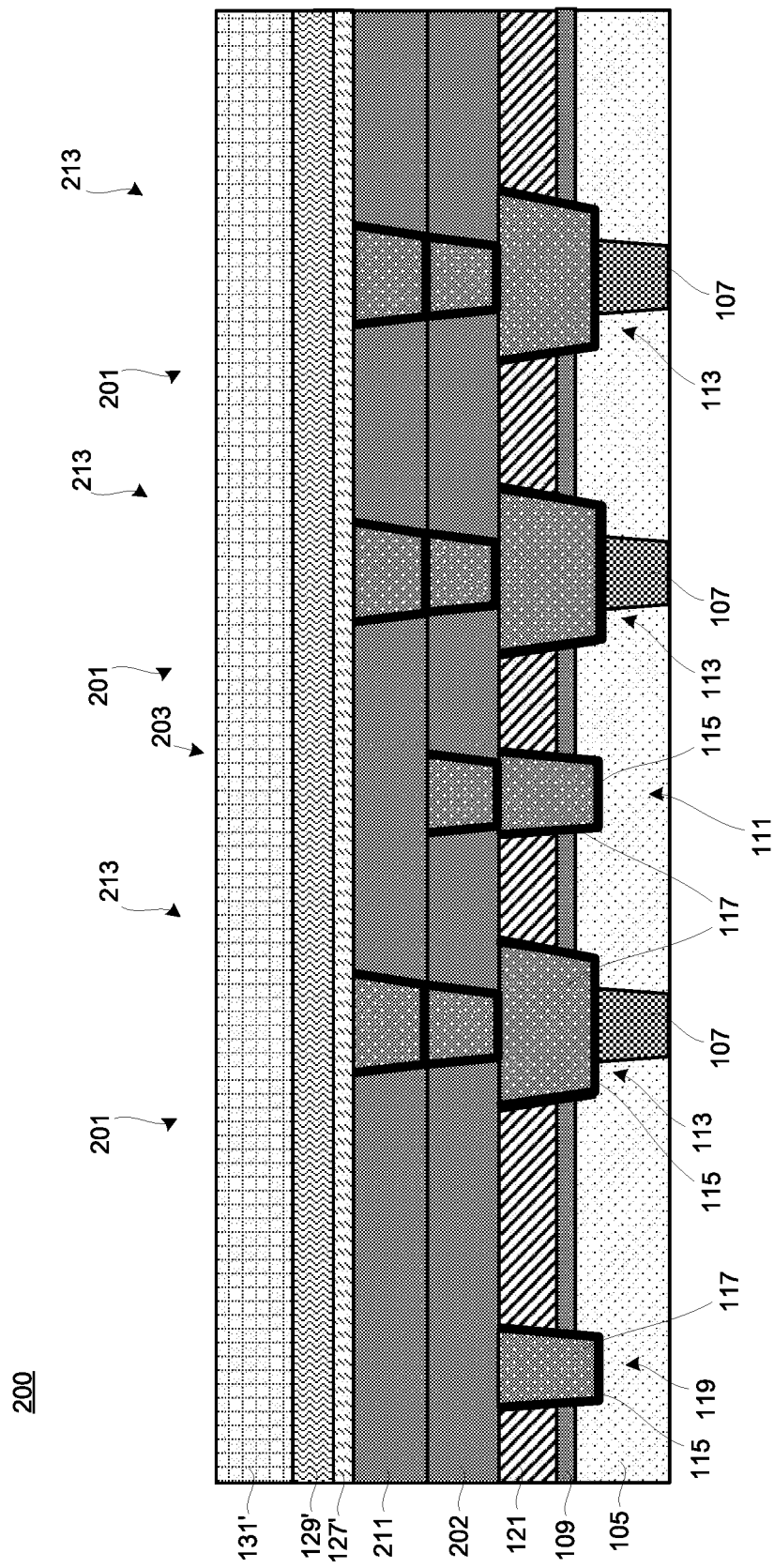

Referring to FIG. 9, bottom electrode (BE) layer 127' may be formed over the dielectric layer 211 and the conductive features 213, MTJ layers 129' may be formed over the BE layer 127', and a top electrode (TE) layer 131' may be formed over the MTJ layers 129'. BE layer 127', MTJ layers 129', and TE layer 131' may be formed of similar materials and with similar processes as described above and further description is not repeated herein.

Figure 10:
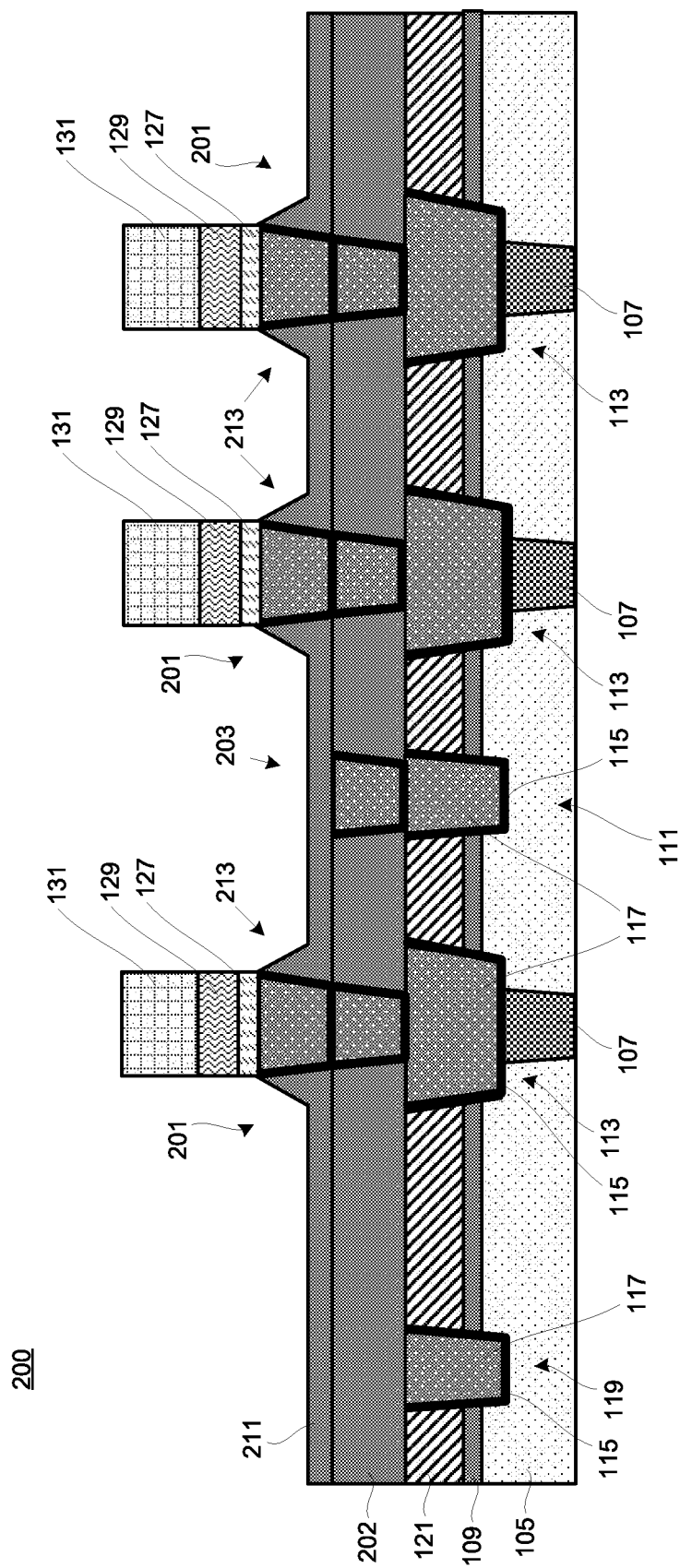

Referring to FIG. 10, MTJ stacks may be formed by patterning the BE layer 127', the MTJ layers 129', and the TE 131'. The patterning process forms a MTJ stack which may include a BE 127, formed from a retained portion of the BE layer 127', a MTJ 129, formed from a retained portion of the MTJ layers 129', and a TE 131, formed from a retained portion of the TE 131'. The layers of the MTJ stack may be generally vertically aligned with substantially coplanar sidewalls and may be located over, such as directly upon, conductive features 213. MTJ stacks may be formed with similar processes as described above and further description is not repeated herein.

In some embodiments, the patterning process may partially etch the dielectric layer 211. In such embodiments, the dielectric layer 211 comprises a sloped portion (generally associated with the conductive feature 213) and flat portion(s). In some embodiments, top surfaces of the sloped portions are above a top surface of the flat portion. In some embodiments, the sloped portions have sloped sidewalls. In some embodiments, the sloped portions have trapezoidal shapes in the illustrated cross-section.

Figure 11:
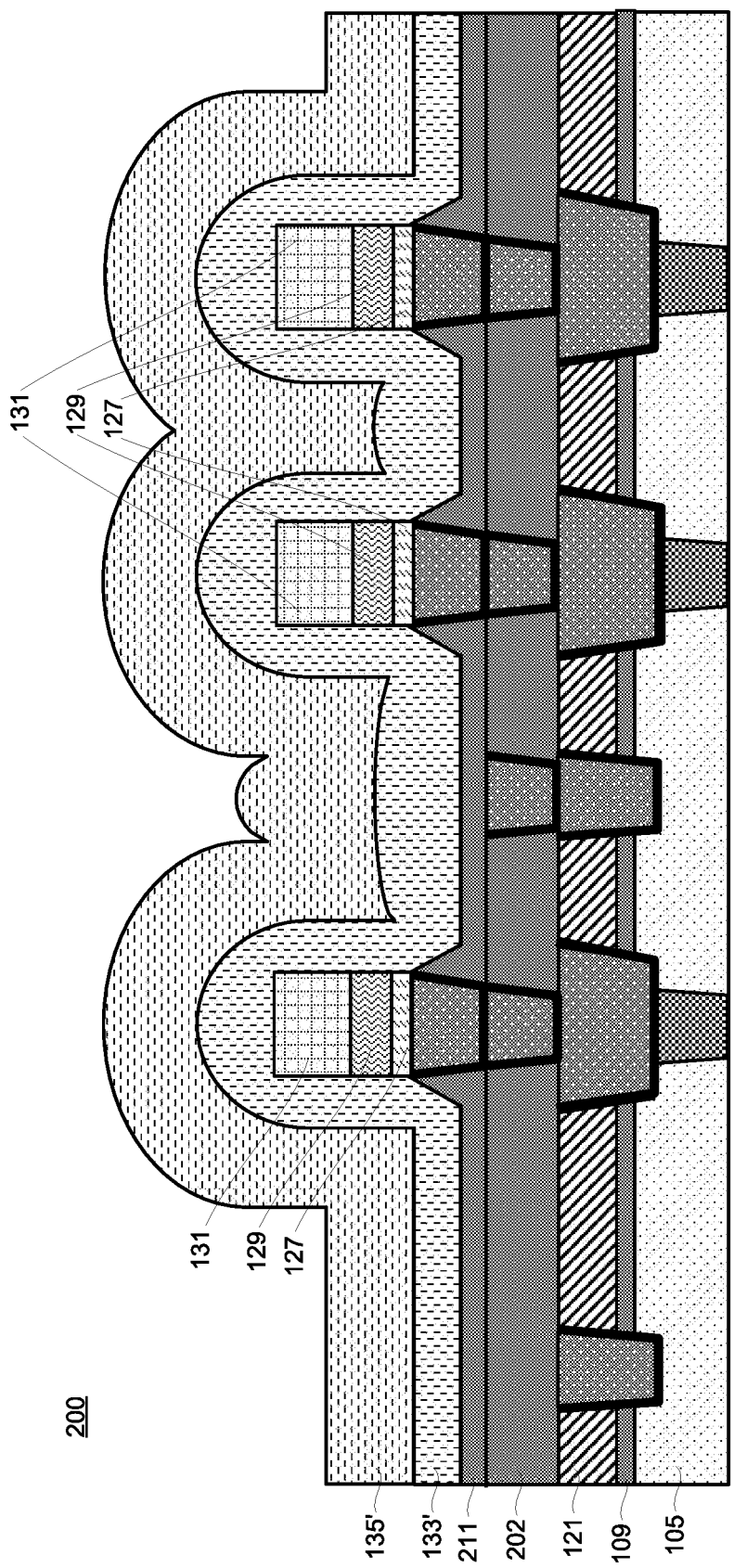

Referring to FIG. 11, after MTJ stack formation, various protective layers may be formed on sidewalls and top surfaces of the MTJ stack. The various protective layers may be formed using similar materials and methods as the various protective layers described above and the descriptions are not repeated herein.

In some embodiments, a passivation layer 133' is blanket formed over the MTJ stack and upon dielectric layer 211. In some embodiments, a second passivation layer 135' may be formed over passivation layer 133'. Passivation layer 133' and second passivation layer 135' may be formed using similar materials and methods as the passivation layer 133', second passivation layer 135' described above and the descriptions are not repeated herein.

Figure 12:
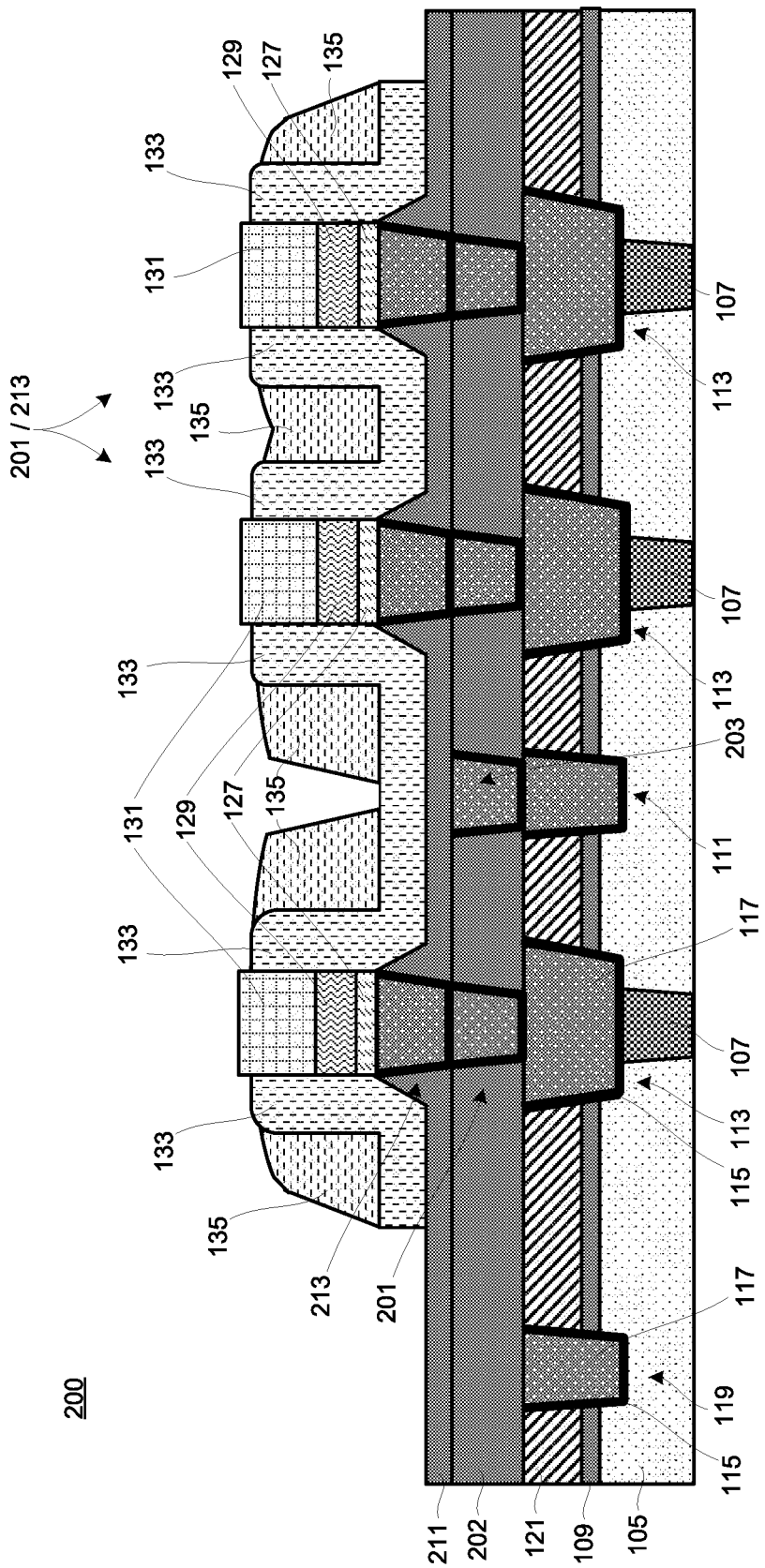

Referring to FIG. 12, an etching process, such as a dry etch, may be performed to etch the passivation layer(s) 133', 135' and to expose top portions of the MTJ stack (e.g., top surface and top sidewall portion(s) of the TE 131). Retained portion(s) of the passivation layer(s) 133', 135' form encapsulation spacers 133, 135, respectively. Spacer 133 may be further located upon the sidewalls of the MTJ stack and may be further located upon the sloped portion of dielectric layer 211. In some embodiments, the etching process is an anisotropic etching process and removes horizontal portions of the passivation layer 133', 135'.

Figure 13:
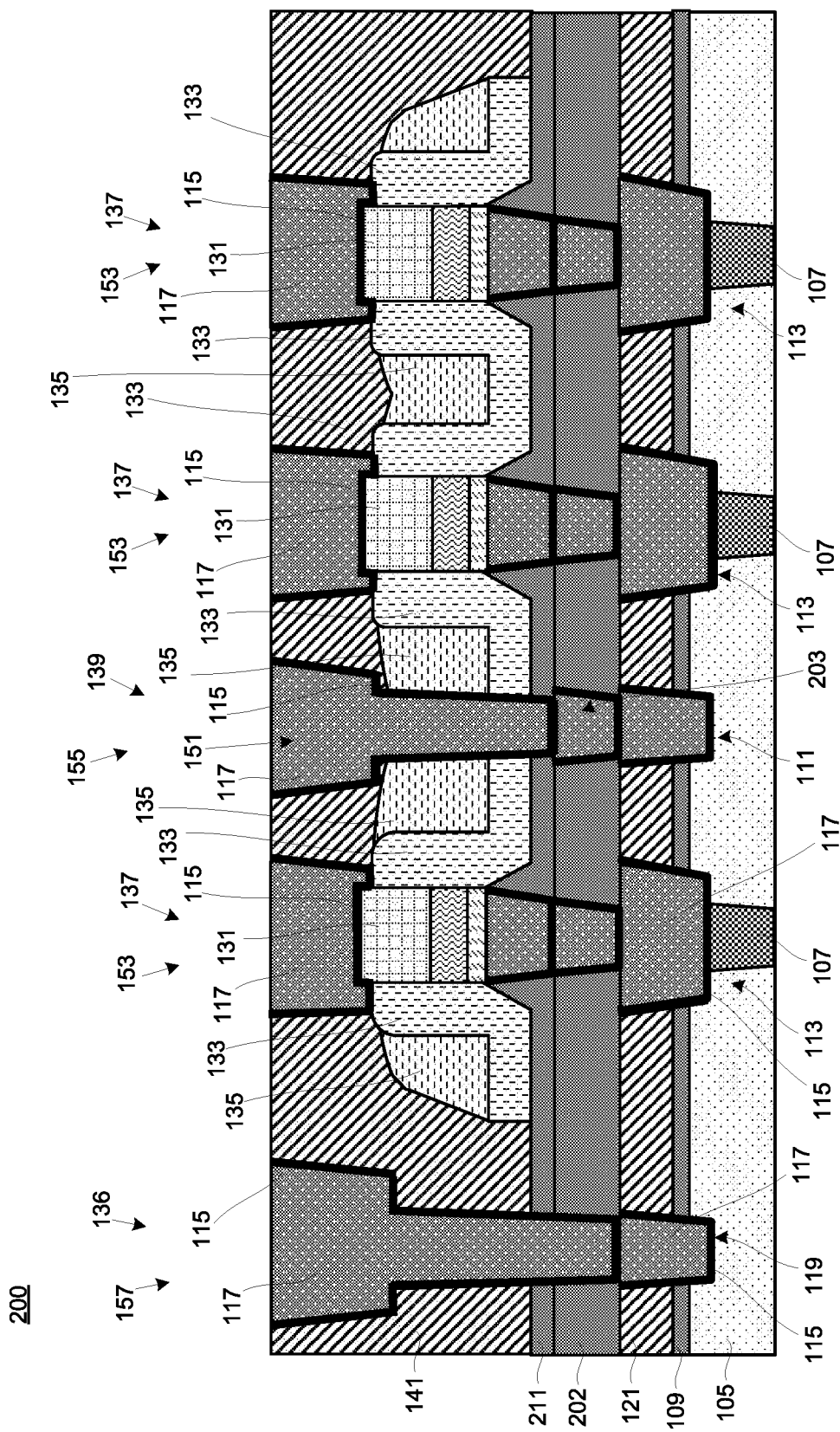

Referring to FIG. 13, one or more inter-layer dielectric 141 layer(s) may be formed upon the dielectric layer 211, upon encapsulation spacer(s) 133, 135, and upon the exposed portion of the MTJ stack. In some embodiments, the dielectric layer(s) 141 may be formed using similar materials and methods as the dielectric layer 121 or other inter-layer dielectrics described above, and the description is not repeated herein. Inter-layer dielectric 141 may be formed to an adequate thickness so that there is a distance between 50 nm and 300 nm between the top surface of the MTJ stack (e.g., top surface of the TE 131) and the top surface of the inter-layer dielectric 141.

Referring to FIG. 13, upper contact opening 139 of the stepped contact 155 may be formed in the dielectric layer 141 and may generally exposes at least a portion (e.g., top surface, etc.) of the conductive feature 203. Upper contact opening 139 may be formed using suitable fabrication methods such as damascene, dual-damascene, or similar processes. Upper contact opening 139 may expose sidewall portion(s) of encapsulation spacer(s) 133, 135 associated with a first MTJ stack and may expose sidewall portion(s) of encapsulation spacer(s) 133, 135 associated with a second MTJ stack that neighbors the first MTJ stack. As depicted, upper contact opening 139 may have a VIA portion that exposes the portion the conductive feature 203 and have a wiring line (e.g., word line) portion over the VIA portion.

Referring to FIG. 13, MTJ contact opening 137 may be formed in the dielectric layer 141 and may generally exposes at least a portion (e.g., top surface of TE 131, top sidewall portions of TE 131, etc.) of the MTJ stack. MTJ contact opening 137 may further expose a portion of encapsulation spacer 133, 135. Upper contact opening 137 may be formed using suitable fabrication methods such as damascene, dual-damascene, or similar processes.

Referring to FIG. 13, logic contact opening 136 may be formed in the dielectric layer 141 and the dielectric layers 211, 202 and may generally expose at least a portion (e.g., top surface, etc.) of the conductive feature 119. Logic contact opening 136 may be formed using suitable fabrication methods such as damascene, dual-damascene, or similar processes. As depicted, logic contact opening 136 may have a VIA portion that exposes the portion the conductive feature 119 and have a wiring line portion (e.g., word line) over the VIA portion.

In some embodiments, upper contact opening 139, MTJ contact opening 137, and/or logic contact opening 136 may be formed in the same fabrication stage, may be formed simultaneously, or the like.

In some embodiments, one or more mask layers (not shown) upon ILD 141 may aid in formation of upper contact opening 139, MTJ contact opening 137, and/or logic contact opening 136. In some embodiments, logic contact opening 136 and/or upper contact opening 139 are formed by a via-first process. In other embodiments, logic contact opening 136 and/or upper contact opening 139 are formed by a trench-first process.

Referring to FIG. 13, upper contact 151 of the stepped contact 155 is formed in the dielectric layer(s) 141 upon and physically connected to the conductive feature 203 within upper contact opening 139. The upper contact 151 may be a conductive line, VIA, or other conductive wiring feature, and may be formed using suitable formation methods such as damascene, dual-damascene, deposition, plating, combinations thereof, or the like. The upper contact 151 may include a VIA portion that physically and electrically connects to the portion the conductive feature 203 exposed by upper contact opening 139. The upper contact 151 may further include a wiring line (e.g., word line) portion over or upon the VIA portion.

As depicted, the wiring line portion of the upper contact 151 may be located within the Mx+1 wiring level. As such, stepped contact 155 may be formed and may include multiple conductive features (i.e., conductive feature 203 and VIA portion of upper contact 151) that physically and electrically connects the Mx+1 wiring level (i.e., wiring line portion of upper contact 151) with the Mx wiring level (i.e., conductive feature 111).

Referring to FIG. 13, upper MTJ contact 153 is formed in the dielectric layer(s) 141 upon and physically connected to the MTJ stack (e.g. connected to TE 131) that is exposed within MTJ contact opening 137. The upper MTJ contact 153 may be a conductive line, VIA, or other conductive wiring feature, and may be formed using suitable formation methods such as damascene, dual-damascene, deposition, plating, combinations thereof, or the like. As depicted, upper MTJ contact 153 may be located within the Mx+1 wiring level.

Referring to FIG. 13, logic region contact 157 may be formed in the dielectric layer(s) 141 and in dielectric layers 211, 202 upon and physically connected to conductive feature 119. Logic region contact 157 may be formed within logic region 100B and may be a conductive line, VIA, or other conductive wiring feature. The logic region contact 157 may be formed using suitable formation methods such as damascene, dual-damascene, deposition, plating, combinations thereof, or the like. The logic region contact 157 may include a VIA portion that physically and electrically connects to the portion the conductive feature 119 exposed by logic contact opening 136. The logic region contact 157 may further include a wiring line (e.g., word line) portion over or upon the VIA portion.

As depicted, the wiring line portion of logic region contact 157 may be located within the Mx+1 wiring level. As such, logic region contact 157 may include a single conductive feature (i.e., VIA portion of logic region contact 157) that physically and electrically connects the Mx+1 wiring level (i.e., wiring line portion of logic region contact 157) with the Mx wiring level (i.e., conductive feature 119).

As depicted, upper contact 151, upper MTJ contact 153, and logic region contact 157 may be formed in the same fabrication stage, may be formed simultaneously, or the like.

In some embodiments, upper contact 151, upper MTJ contact 153, and/or logic region contact 157 includes conductive region(s) 117 and conductive barrier layer(s) 115 lining sidewalls and bottom surfaces of the conductive region(s) 117. A planarization process, such as CMP process or a mechanical grinding process, may remove excess upper contact 151 material(s), upper MTJ contact 153 material(s), and logic region contact 157 material(s) and may planarize the top surface of dielectric layer 141, the top surface of upper contact 151, upper MTJ contact 153, and logic region contact 157.

For clarity, semiconductor device 200 may include stepped contact 155, which includes a greater number of different contact structures (i.e., contact structures formed in different fabrication stages) relative to logic region contact 157. In other words, stepped contact 155 includes a greater number of different contact structures that physically connect the Mx wiring level to the Mx+1 wiring level relative to the logic region contact 157.

For clarity, semiconductor device 200 may include conductive feature 201 and conductive feature 203, which may be simultaneously formed, and in which the top surface of conductive feature 201 is substantially coplanar with the top surface of conductive feature 203. Semiconductor device 200 may include conductive feature 213 over conductive feature 201. As such, semiconductor device 200 may include a dual or multi-layered memory pillar below the MTJ stack in physical and electrical contact with the BE 127.

The top surface of conductive feature 213 may be above the top surface of conductive feature 203. This relatively lower top surface of conductive feature 203 may be caused, at least in part, by the dual or multi-layered dielectrics 202, 211 in which the conductive feature 203 and conductive feature 213 are formed, respectively. Conductive features 201, 203, and 213 are formed above the Mx wiring level and formed within the memory region 100A of semiconductor device 100.

For clarity, the lower or bottom surface of upper contact 151 of the stepped contact 155 is above the lower or bottom surface of logic region contact 157. In other words, the length of upper contact 151 is shorter than the length of the simultaneously formed logic region contact(s) 157.

The inclusion of stepped contact 155 may allow the use of a multi-layer encapsulation spacers 133, 135 that fill out tight spacing between memory pillars (i.e., the combined conductive features 201, 213) and associated MTJ stacks, and which may decrease the propensity of void formation and resulting shorting between neighboring memory pillars and/or between neighboring MTJ stacks. As the spacing pitches continue to decrease in advanced nodes, the inclusion of stepped contact(s) 155, where needed, may allow for continued inclusion of MRAM technology therein.

Figure 14:
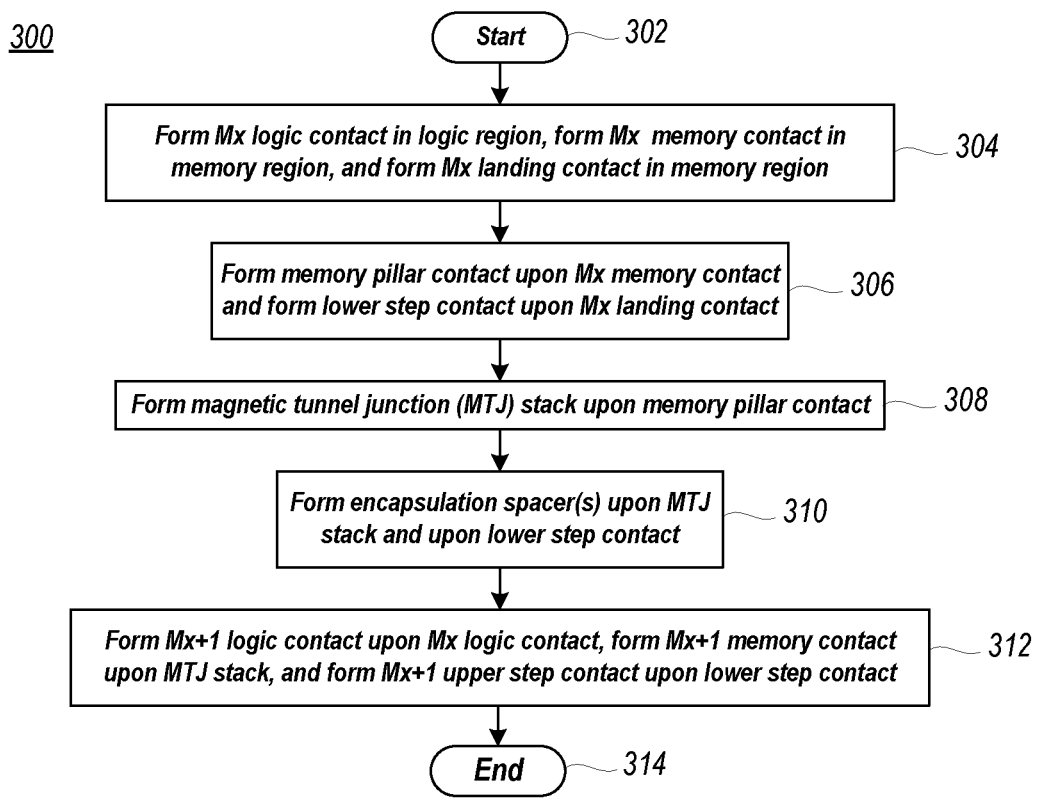
FIG. 14 and FIG. 15 are flow diagrams illustrating semiconductor device fabrication methods, in accordance with one or more embodiments.

FIG. 14 is a flow diagram illustrating a semiconductor device fabrication method 300, in accordance with one or more embodiments. Method 300 may be exemplarily utilized to fabricate semiconductor device 100. Method 300 begins at block 302 and may continue with forming a Mx wiring level logic contact (i.e., conductive feature 119) in logic region 100B, with forming a Mx wiring level memory contact (i.e., conductive feature 113) in memory region 100A, and with forming a Mx wiring level landing contact (i.e., conductive feature 111) in memory region 100A (block 304). In some embodiments, the Mx wiring level logic contact, the Mx wiring level memory contact, and the Mx wiring level landing contact may be simultaneously formed, formed in the same fabrication stage, or the like. These Mx wiring level contacts may have substantially the same depth or thickness. In some embodiments, method 300 may further include forming a dielectric layer upon the Mx wiring level. For example, dielectric layer 123' may be formed upon the top dielectric layer of the Mx wiring level (i.e., dielectric layer 121), may be further formed upon conductive feature 119, may be further formed upon conductive feature 113, and may be further formed upon conductive feature 111.

Method 300 may continue with forming a memory pillar contact (i.e., conductive feature 125) upon the Mx wiring level memory contact and forming a lower step contact (conductive feature 124) upon the Mx wiring level landing contact (block 306). For example, conductive feature 125 is formed within dielectric layer 123' and upon conductive feature 113 and conductive feature 124 is formed within dielectric layer 123' and upon conductive feature 111. In some embodiments, the memory pillar contact and the lower step contact may be simultaneously formed, formed in the same fabrication stage, or the like.

Method 300 may continue with forming a MTJ stack upon the memory pillar contact (block 308). The MTJ stack may be fabricated in the conjunction of forming a memory (e.g., MRAM) cell. The MTJ stack may formed by patterning a BE layer 127', MTJ layers 129', and TE layer 131' that are sequentially formed upon the dielectric layer 123' and upon the memory pillar contact. The patterning process forms a MTJ stack which may include a BE 127 upon the memory pillar contact, formed from a retained portion of the BE layer 127', a MTJ 129, formed from a retained portion of the MTJ layers 129', and a TE 131, formed from a retained portion of the TE 131'. The patterning of the MTJ stack may partially recess the lower step contact relative to the memory pillar contact. As such, the upper surface of the lower step contact may be below the upper surface of the memory pillar contact. The patterning of the MTJ stack may also partially recess dielectric layer 123' to become dielectric layer 123.

After MTJ stack formation, various protective layers may be formed on sidewalls and top surfaces of the MTJ stack. In some embodiments, oxide layers may be formed on sidewalls of the MTJ stack. In some embodiments, the oxide layers comprise oxides of metal elements that form the MTJ stack and may be formed using an oxidation process. In some embodiments, the oxide layers prevent electron flow along the sidewalls of the MTJ stack that may adversely affect magnetic performance of the MTJ layers 129. In some embodiment, the oxide layers may have a thickness between about 5 Å and about 15 Å.

Method 300 may continue with forming one or more encapsulation spacers (e.g., encapsulation spacers 133, 135) upon the sidewalls of the MTJ stack (block 310). The encapsulation spacers 133 may be formed by forming a passivation layer 133' over the MTJ stack and upon dielectric layer 123. The encapsulation spacers 135 may be formed by forming a passivation layer 135' over passivation layer 133'. An etching process, such as a dry etch, may be performed to etch the passivation layer 133', 135' and to expose top portions of the MTJ stack (e.g., top portion(s) and/or top surface of the TE 131). Retained portion(s) of the passivation layer 133' may form encapsulation spacers 133 located upon the sidewalls of the MTJ stack. Retained portion(s) of the passivation layer 135' may form encapsulation spacers 135 located upon the encapsulation spacers 133. In some embodiments, the etching process is an anisotropic etching process and removes horizontal portions of the passivation layer 133', 135'.

In some embodiments, method 300 may continue with forming one or more inter-layer dielectric 141 layer(s) upon dielectric layer 123, upon encapsulation spacer(s) 133, 135 and upon the exposed portion of the MTJ stack.

Method 300 may continue with forming a Mx+1 wiring level logic contact (i.e., logic region contact 157) upon the Mx wiring level logic contact, with forming a Mx+1 memory contact (i.e., upper MTJ contact 153) upon the MTJ stack, and with forming a Mx+1 upper step contact (i.e., upper contact 151) upon the lower step contact (block 312). The fabrication of the lower step contact between the Mx+1 upper step contact and the Mx wiring level landing contact forms stepped contact 155. Method 300 may end at block 314.

Figure 15:
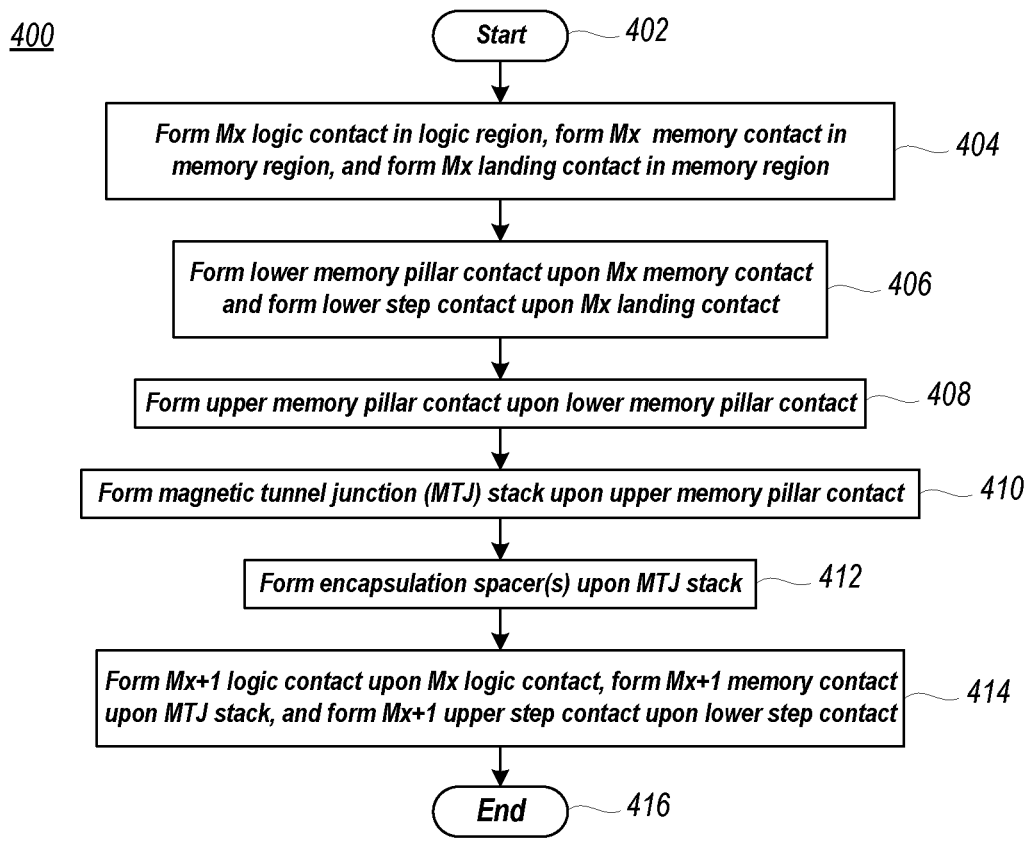

FIG. 15 is a flow diagram illustrating a semiconductor device fabrication method 400, in accordance with one or more embodiments. Method 400 may be exemplarily utilized to fabricate semiconductor device 200. Method 400 begins at block 402 and may continue with forming a Mx wiring level logic contact (i.e., conductive feature 119) in logic region 100B, with forming a Mx wiring level memory contact (i.e., conductive feature 113) in memory region 100A, and with forming a Mx wiring level landing contact (i.e., conductive feature 111) in memory region 100A (block 404). In some embodiments, the Mx wiring level logic contact, the Mx wiring level memory contact, and the Mx wiring level landing contact may be simultaneously formed, formed in the same fabrication stage, or the like. These Mx wiring level contacts may have substantially the same depth or thickness. In some embodiments, method 400 may further include forming a dielectric layer upon the Mx wiring level. For example, dielectric layer 202 may be formed upon the top dielectric layer of the Mx wiring level (i.e., dielectric layer 121), may be formed upon conductive feature 119, may be formed upon conductive feature 113, and may be formed upon conductive feature 111.

Method 400 may continue with forming a lower memory pillar contact (i.e., conductive feature 201) upon the Mx wiring level memory contact and forming a lower step contact (conductive feature 203) upon the Mx wiring level landing contact (block 406). For example, conductive feature 201 is formed within dielectric layer 202 and upon conductive feature 113 and conductive feature 203 is formed within dielectric layer 202 and upon conductive feature 111. In some embodiments, the lower memory pillar contact and the lower step contact may be simultaneously formed, formed in the same fabrication stage, or the like. In some embodiments, method 400 may further include forming a dielectric layer upon the dielectric layer 202. For example, dielectric layer 211 may be formed upon the dielectric layer 202, may be formed upon conductive feature 201, and may be formed upon conductive feature 203.

Method 400 may continue with forming an upper memory pillar contact (i.e., conductive feature 213) upon the lower memory pillar contact (block 408). For example, conductive feature 213 is formed within dielectric layer 211 and upon conductive feature 201.

Method 400 may continue with forming a MTJ stack upon the upper memory pillar contact (block 410). The MTJ stack may be fabricated in the conjunction of forming a memory (e.g., MRAM) cell. The MTJ stack may formed by patterning a BE layer 127', MTJ layers 129', and TE layer 131' that are sequentially formed upon the dielectric layer 211 and upon the upper memory pillar contact. The patterning process forms a MTJ stack which may include a BE 127, formed from a retained portion of the BE layer 127', a MTJ 129, formed from a retained portion of the MTJ layers 129', and a TE 131, formed from a retained portion of the TE 131'.

After MTJ stack formation, various protective layers may be formed on sidewalls and top surfaces of the MTJ stack. In some embodiments, oxide layers may be formed on sidewalls of the MTJ stack. In some embodiments, the oxide layers comprise oxides of metal elements that form the MTJ stack and may be formed using an oxidation process. In some embodiments, the oxide layers prevent electron flow along the sidewalls of the MTJ stack that may adversely affect magnetic performance of the MTJ layers 129. In some embodiment, the oxide layers may have a thickness between about 5 Å and about 15 Å.

Method 400 may continue with forming one or more encapsulation spacers (e.g., encapsulation spacers 133, 135) upon the sidewalls of the MTJ stack (block 412). The encapsulation spacers 133 may be formed by forming a passivation layer 133' over the MTJ stack and upon dielectric layer 211. The encapsulation spacers 135 may be formed by forming a passivation layer 135' over passivation layer 133'. An etching process, such as a dry etch, may be performed to etch the passivation layer 133', 135' and to expose top portions of the MTJ stack (e.g., top portion(s) and/or top surface of the TE 131). Retained portion(s) of the passivation layer 133' may form encapsulation spacers 133 located upon the sidewalls of the MTJ stack. Retained portion(s) of the passivation layer 135' may form encapsulation spacers 135 located upon the encapsulation spacers 133. In some embodiments, the etching process is an anisotropic etching process and removes horizontal portions of the passivation layer 133', 135'.

In some embodiments, method 400 may continue with forming one or more inter-layer dielectric 141 layer(s) upon encapsulation spacer(s) 133, 135 and upon the exposed portion of the MTJ stack.

Method 400 may continue with forming a Mx+1 wiring level logic contact (i.e., logic region contact 157) upon the Mx wiring level logic contact, with forming a Mx+1 memory contact (i.e., upper MTJ contact 153) upon the MTJ stack, and with forming a Mx+1 upper step contact (i.e., upper contact 151) upon the lower step contact (block 414). The fabrication of the lower step contact between the Mx+1 upper step contact and the Mx wiring level landing contact forms stepped contact 155. Method 400 may end at block 416.

The method flow diagrams depicted herein are exemplary. There can be many variations to the diagrams or operations described therein without departing from the spirit of the embodiments. For instance, the operations can be performed in a differing order, or operations can be added, deleted, or modified. All these variations are considered a part of applicable claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
   a Mx wiring level comprising a pair of lower conductive memory contacts within a memory region, a landing contact between the pair of lower conductive memory contacts, and a lower logic contact within a logic region;
   a conductive memory pillar upon each of the lower conductive memory contacts;
   a lower step contact upon the landing contact, the lower step contact comprising a top surface that is below a respective top surface of each of the conductive memory pillars;
   a magnetic tunnel junction stack upon each of the conductive memory pillars, each magnetic tunnel junction stack comprising a bottom electrode, magnetic tunnel junction layers upon the bottom electrode, and a top electrode upon the magnetic tunnel junction layers;
   a Mx+1 wiring level comprising an upper conductive memory contact upon each magnetic tunnel junction stack, an upper step contact upon the lower step contact, and an upper logic contact upon the lower logic contact.

2. The semiconductor device of claim 1, wherein a bottom surface of the upper step contact is above a bottom surface of the upper logic contact.

3. The semiconductor device of claim 1, wherein a first portion of a first encapsulation spacer physically connects a sidewall of a magnetic tunnel junction stack with a sidewall of the upper step contact.

4. The semiconductor device of claim 3, wherein a second encapsulation spacer physically connects a second portion of the first encapsulation spacer with the sidewall of the upper step contact.

5. The semiconductor device of claim 1, wherein the lower step contact physically and electrically connects the upper step contact with the landing contact.

6. The semiconductor device of claim 1, wherein sidewalls of the landing contact are substantially coplanar with sidewalls of the lower step contact.

7. A semiconductor device comprising:
   a Mx wiring level comprising a pair of lower conductive memory contacts within a memory region, a landing contact between the pair of lower conductive memory contacts, and a lower logic contact within a logic region;
   a conductive memory pillar upon each of the lower conductive memory contacts, each conductive memory pillar comprising a lower pillar contact and an upper pillar contact;
   a lower step contact upon the landing contact;
   a magnetic tunnel junction stack upon each of the conductive memory pillars, each magnetic tunnel junction stack comprising a bottom electrode, magnetic tunnel junction layers upon the bottom electrode, and a top electrode upon the magnetic tunnel junction layers;
   a Mx+1 wiring level comprising an upper conductive memory contact upon each magnetic tunnel junction stack, an upper step contact upon the lower step contact, and an upper logic contact upon the lower logic contact.

8. The semiconductor device of claim 7, wherein a bottom surface of the upper step contact is above a bottom surface of the upper logic contact.

9. The semiconductor device of claim 7, wherein a top surface of the lower step contact is below a respective top surface of each of the upper pillar contacts.

10. The semiconductor device of claim 7, wherein a first portion of the first encapsulation spacer physically connects a sidewall of a magnetic tunnel junction stack with a sidewall of the upper step contact.

11. The semiconductor device of claim 10, wherein a second encapsulation spacer physically connects a second portion of the first encapsulation spacer with the sidewall of the upper step contact.

12. The semiconductor device of claim 7, wherein the lower step contact physically and electrically connects the upper step contact with the landing contact.

* * * * *